United States Patent
Taguchi et al.

Patent Number: 5,345,172
Date of Patent: Sep. 6, 1994

[54] DOUBLE-SLICE IMAGING METHOD IN NMR IMAGING APPARATUS

[75] Inventors: Jun'ichi Taguchi, Sagamihara; Koichi Sano, Yokohama, both of Japan

[73] Assignees: Hitachi, Ltd.; Hitachi Medical Corp., both of Tokyo, Japan

[21] Appl. No.: 894,352

[22] Filed: Jun. 4, 1992

[30] Foreign Application Priority Data

Jun. 5, 1991 [JP] Japan ................... 3-134023

[51] Int. Cl.$^5$ ............................ G01R 33/20
[52] U.S. Cl. ................................ 324/309
[58] Field of Search ......... 324/300, 307, 308, 309, 324/310, 311, 312, 313, 314; 128/653.2, 653.5

[56] References Cited

U.S. PATENT DOCUMENTS

| | | | |
|---|---|---|---|
| 4,796,635 | 1/1989 | Dumoulin | 128/653 |
| 5,022,397 | 6/1991 | Dumoulin | 128/653 |
| 5,022,398 | 6/1991 | Dumoulin | 128/653 |
| 5,025,788 | 6/1991 | Dumoulin | 128/653 |
| 5,038,783 | 8/1991 | Dumoulin | 128/653 |
| 5,038,784 | 8/1991 | Dumoulin | 128/653 |
| 5,202,631 | 4/1993 | Harms et al. | 324/309 |

OTHER PUBLICATIONS

Magnetic Resonance in Medicine, vol. 13 (1990), pp. 279–292 (no Month).
Journal of Magnetic Resonance vol. 41 (1980), pp. 112–126 (no Month).

*Primary Examiner*—Michael J. Tokar
*Attorney, Agent, or Firm*—Antonelli, Terry, Stout & Kraus

[57] ABSTRACT

To accomplish double-slice imaging by a nuclear magnetic resonance (NMR) imaging apparatus having an ordinary radio frequency magnetic field generator, two radio frequency magnetic field waveforms are used and slices are separated by subsequent calculation. More definitely, two slice portions are excited in a REAL direction by a COS waveform and are excited in an IMAG direction by a SIN waveform. When one of the slices is S1 with the other being S2, the signal SC when the COS waveform is used is S1+S2 while the signal SS when the SIN waveform is used is i.S1−i.S2. Therefore, the calculation for separating the slices proves SC+i.SS and SC−i.SS. The present invention can avoid the increase in the production cost of the apparatus due to the addition of hardwares.

6 Claims, 17 Drawing Sheets

FIG. 12

```
PROGRAM COSRF
DIMENSION RF(512),FR(0:4),FI(4)
PAI2=2·3,141593

FR(0)=90
FR(1)=90
FR(2)=45
FR(3)=0
FR(4)=0
FI(1)=0
FI(2)=0
FI(3)=0
FI(4)=0

RATIO=PAI2/360

DO 10  I=1,512
         RF(I)=FR(0)·RATIO
10    CONTINUE

DO 30 J=1,4
         DO 20 I=1,512
            RF(I)=RF(I)+FR(J)·COS(PAI2·(I-257)/512.0·J)·RATIO·2
            RF(I)=RF(I)+FI(J)·SIN(PAI2·(I-257)/512.0·J)·RATIO·2
20       CONTINUE
30    CONTINUE
```

DOUBLE-SLICE IMAGING METHOD IN NMR IMAGING APPARATUS

BACKGROUND OF THE INVENTION

This invention relates in an improvement in a radio frequency (RF) magnetic field waveform in a nuclear magnetic resonance (NMR) imaging apparatus. More in particular, it relates to a double-slice imaging method for imaging slices double in number in comparison to an ordinary method.

The following references (1) to (3) are known as related art.

(1) H. P. Hafner, "Magnetic Resonance in Medicine", Vol. 13 (1990), pp. 279–292

(2) G. H. Glover, "POMP Imaging: A New High Efficiency Technique", Society of Magnetic Resonance in Medicine, Seventh Annual Meeting and Exhibition, Vol. 1 (1988), p. 241

(3) A. A. Maudsly, "Journal of Magnetic Resonance", Vol. 41, (1980), pp. 112–126

The techniques (1) to (3) are accomplished by an NMR imaging apparatus having an RF magnetic field generator having a QD signal generation function shown in FIG. 5. The reference (3) describes the structure of the RF magnetic field generator for generating the QD signal. To generate the QD signal, a radio frequency reference frequency signal is separated into reference frequency signals having four phases of 0°, 90°, 180° and 270°. After these signals are independently amplitude-modulated, they are again synthesized with one another. In this instance, the reference frequency signals having the phases of 0° and 180° are allowed to correspond to REAL and those having the phases of 90° and 270°, to IMAG components. When these REAL and IMAG are independently amplitude-modulated, a plurality of slices can be simultaneously excited with arbitrary weighting.

The reference (1) describes the principle of double-slice imaging and its simulation result. In the case of double-slice imaging for obtaining two separate slice images from two kinds of measured signal data, two slices are simultaneously excited. The absolute values of two signals generated from the two slices after excitation are hereby called S1 and S2. In the first measurement, the reference frequency signals corresponding to REAL and IMAG are amplitude-modulated so as to attain S1+S2, and in the second measurement, to attain S1−S2. S1 can be obtained by (A+B)/2 and S2, by (A−B)/2. In the present invention, however, symbols different from those described in the reference (1) are defined.

The reference (2) describes a method which generally carries out N-fold slice imaging. This reference elaborates so that the calculation for separating the slices proves to be similar to the Fourier transform as the calculation method for image reconstruction. When N=2, however, this reference becomes exactly the same as double-slice imaging described in the reference (1).

The reference (3) describes a definite application by an imaging method which is referred to as "line scanning". This reference makes the most of a spin echo method, and simultaneously excites a plurality of lines on one slice by a weight of an Hadamard matrix. The signals so generated are measured, and each line is separated by subsequent processing. The reference describes a definite application by line scanning imaging and the concept of this reference (3) can be applied to double-slice imaging, too. In other words, double-slice imaging can be carried out when the number of lines is 2 and each line is replaced by a slice, by methods known at the present time.

The effect brought forth by double-slice imaging and N-fold slice imaging lies in that higher efficiency can be obtained by simultaneously exciting a plurality of slices and observing them than when separate excitation and observation is made, as described in the references (2) and (3). When the same number of slices are measured for the same measurement time, a signal-to-noise ratio (S/N) of the final image is higher by simultaneous excitation and observation than by separate excitation and observation.

However, the references (1), (2) and (3) described above cannot be accomplished by the NMR imaging apparatus having the RF magnetic field generator shown in FIG. 3.

SUMMARY OF THE INVENTION

It is an object of the present invention to provide a method which accomplishes double-slice imaging by the use of the NMR imaging apparatus having the RF magnetic field generator shown in FIG. 3.

In other words, simultaneous excitation and measurement of slices are carried out by generating an RF magnetic field mainly having Fourier COS components and an RF magnetic field mainly having Fourier SIN components.

The absolute value of the signal of one of the slices to be imaged is assumed as S1 and the absolute value of the other, S2. The RF magnetic field having the Fourier components having the COS component generates a signal A which corresponds to S1+S2. The RF magnetic field mainly having Fourier SIN components generates a signal B which corresponds to i.S1−i.S2. The signal S1 of one of the slices can be determined by (A−i.B)/2, and the other S2, by (A+i.B)/2.

BRIEF DESCRIPTION OF THE DRAWINGS

FIG. 12 shows an example of a program for generating RF pulse waveforms;

DESCRIPTION OF THE PREFERRED EMBODIMENTS

Figure 1:
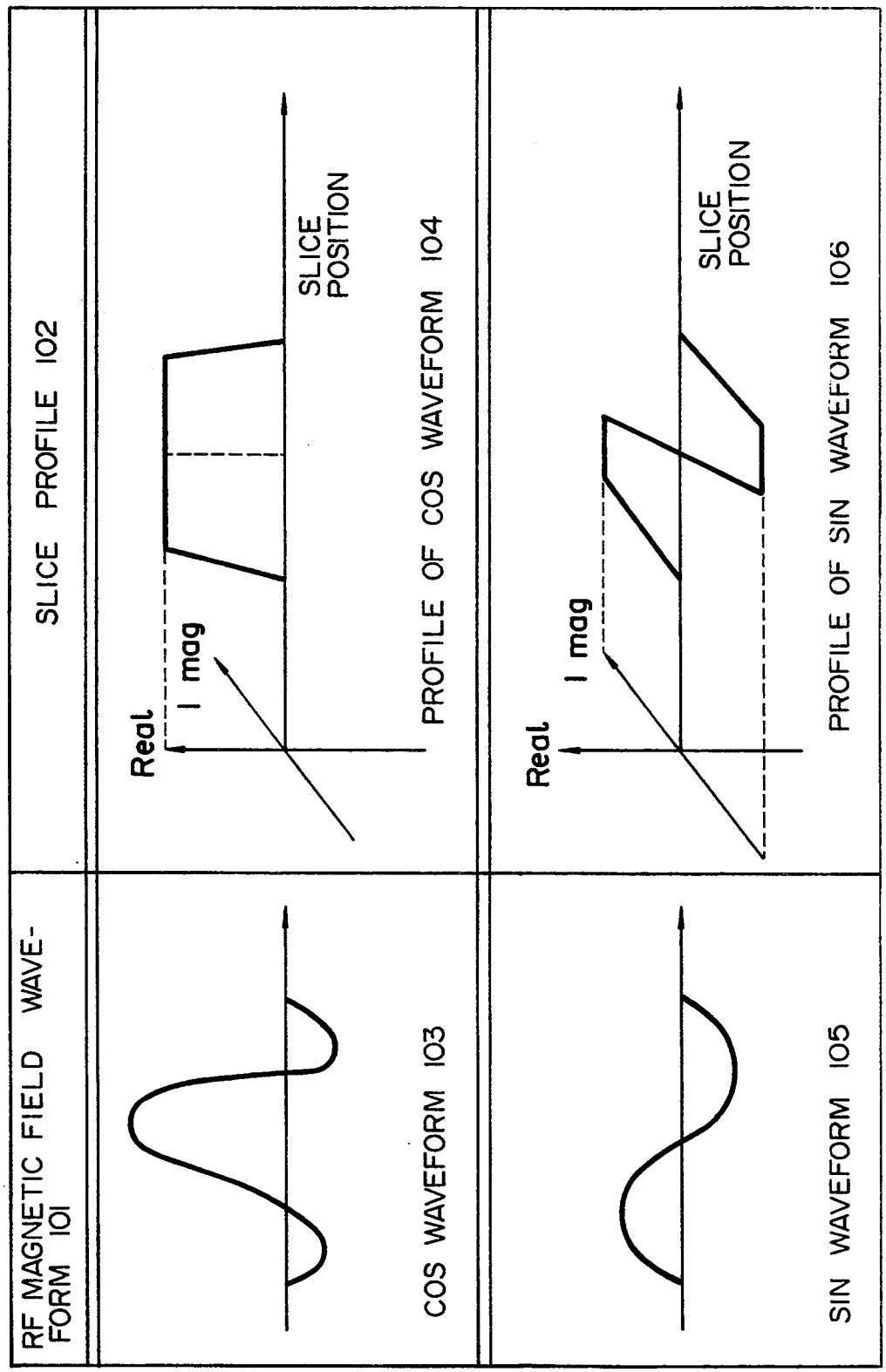
FIG. 1 is a diagram showing the correspondence relation between RF magnetic field waveforms and slice profiles, respectively.

Hereinafter, preferred embodiments of the present invention will be dividedly described in paragraphs (1) to (11). An overall structure of an NMR imaging apparatus will be described in the paragraph (1), a typical type of a radio frequency (RF) magnetic field generator and its structure, which particularly relates to the present invention, will be described in the paragraph (2), the relation of the RF magnetic field generator of each type, in the paragraph (3), and the types of the RF magnetic field generators utilized in the present invention, in the paragraph (4). A general explanation will be given about the properties of magnetization as the preliminary explanation of the embodiments of the present invention in the paragraph (5), the outline of the present invention, in the paragraph (6), its operation, in the paragraph (7), the detail explanation of each part, in the paragraphs (8) and (9), and expanded and modified embodiments, in the paragraphs (10) and (11).

(1) General Explanation of Construction of NMR Imaging Apparatus

Figure 2:
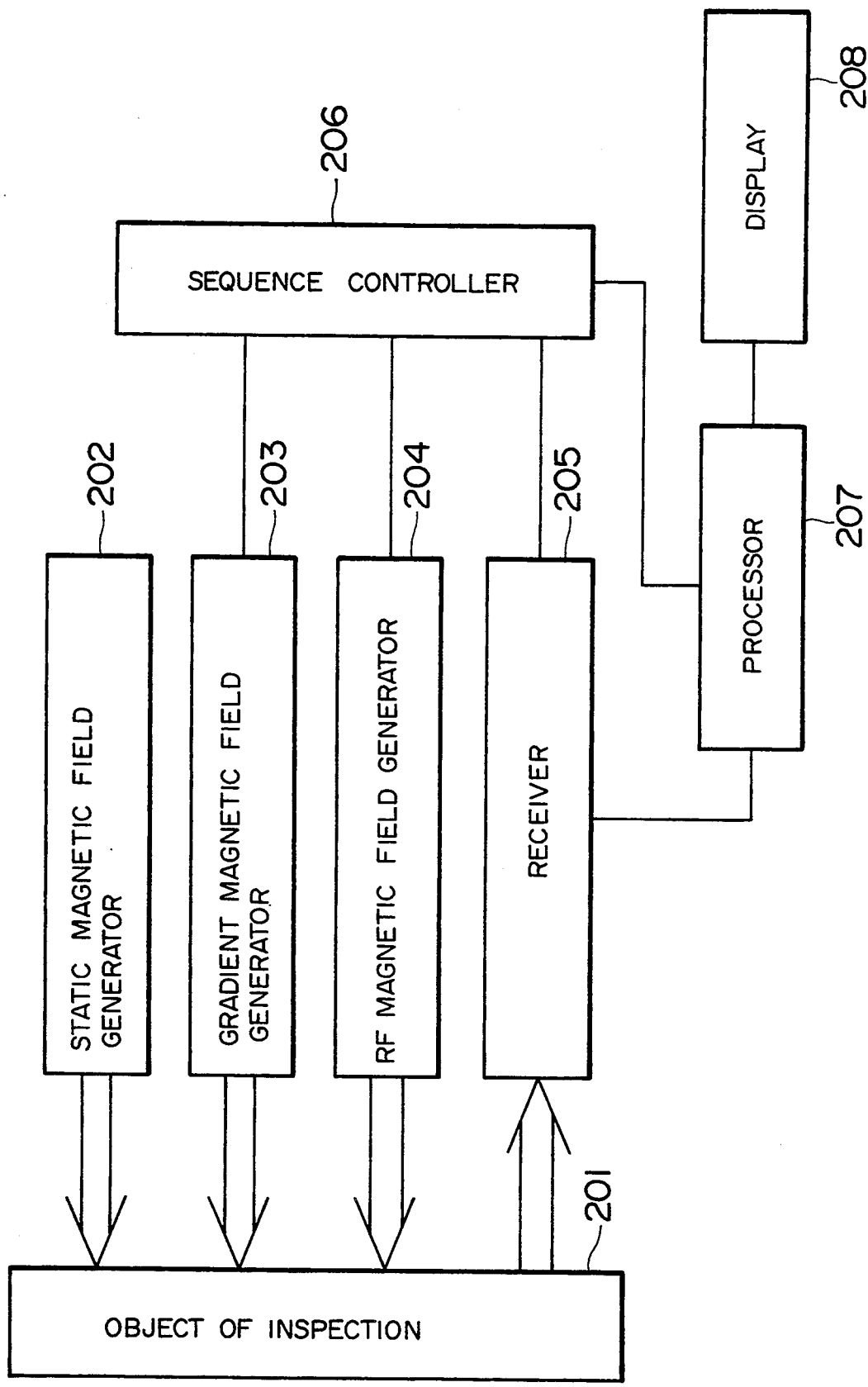
FIG. 2 is a block diagram of an NMR imaging apparatus.

FIG. 2 is a structural view of an NMR imaging apparatus for executing the present invention.

Magnetization develops in an object 201 of inspection due to the magnetic field generated by a static magnetic field generator 202. A sequence controller 206 performs various operations necessary for imaging a tomogram representing the density distribution of the magnetization occurring in the inspection object 201.

The sequence controller 206 controls a gradient magnetic field generator 203, an RF magnetic field generator 204, a receiver 205 and a processor 207.

The gradient magnetic field generator 203 generates a gradient magnetic field the intensity of which changes linearly depending on a place. This generator can generate a gradient magnetic field having an arbitrary intensity at an arbitrary time within the range permitted by performance of the apparatus. It also functions so as to impart position data to the magnetization occurring in the inspection object 201.

The RF magnetic field generator 204 generates an RF magnetic field, and imparts electromagnetic oscillation to the magnetization occurring in the inspection object 201. It provides energy to the magnetization satisfying the resonance condition and to allows it to emit an electromagnetic wave.

The receiver 205 receives the electromagnetic wave generated when the magnetization of the inspection object 201 is under the excitation state, and delivers measurement data to the processor 207.

The processor 207 preserves the measurement data, executes various processings such as imaging, and preserves image data. It delivers the image data, etc., to a display 208, whenever necessary.

(2) Typical Type of RF Magnetic Field Generator and Its Structure

Various types of RF magnetic field generators are known, and FIGS. 3 to 6 illustrate some of their typical examples.

Figure 3:
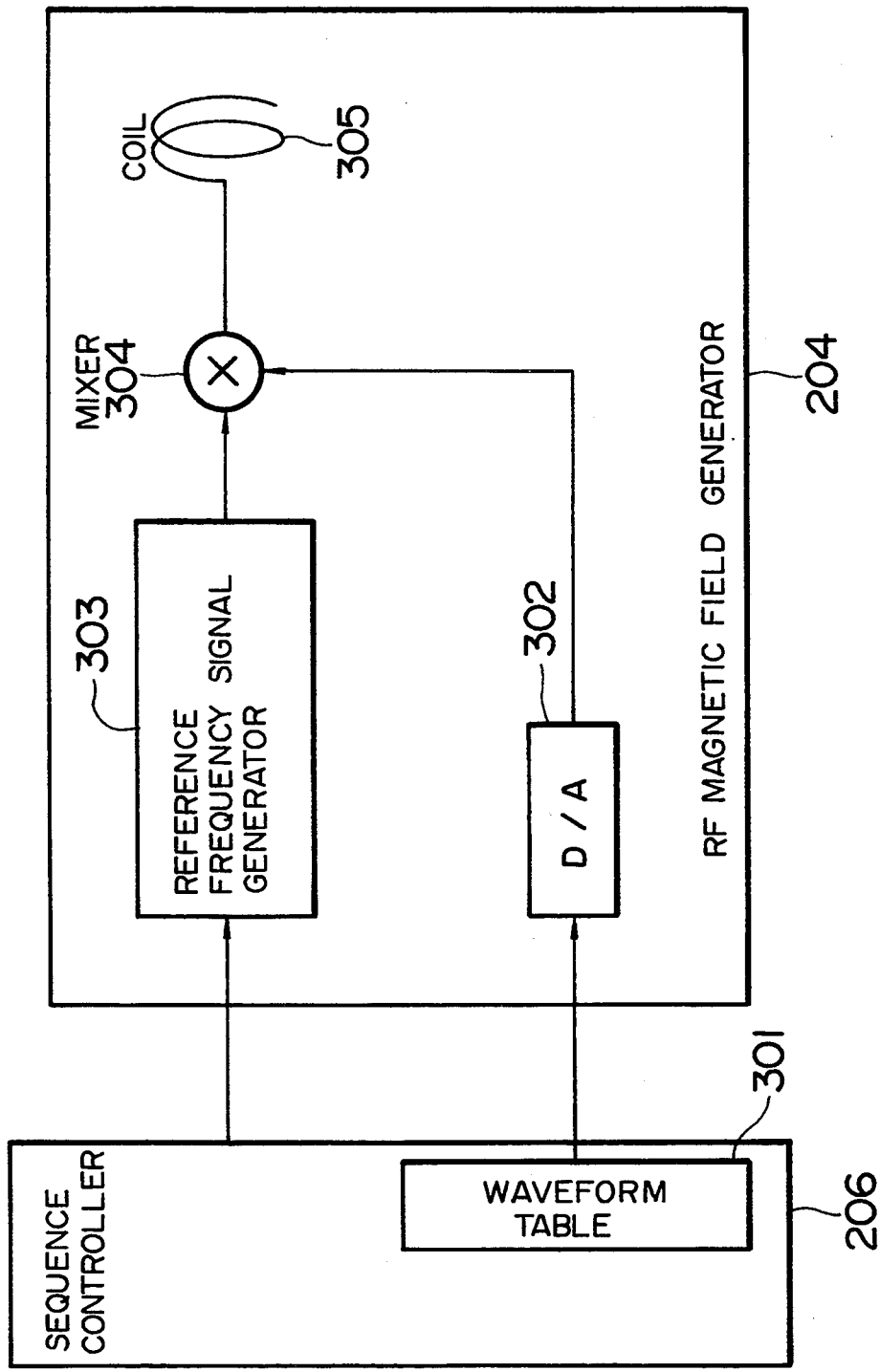
FIG. 3 is a structural view of a typical RF magnetic field generator that is used generally.

The RF magnetic field generator shown in FIG. 3 is of the most simplified type. It has only one reference frequency signal generator 303 of a radio frequency. The RF reference frequency signal is amplitude-modulated to generate an RF signal having a band, which is irradiated by a coil 305 to generate an RF magnetic field. The amplitude modulation waveform necessary for amplitude modulation is stored in a waveform table 301. The sequence controller 206 sends a digital signal having the amplitude modulation waveform to the RF magnetic field generator 204 by referring to this waveform table 301. A digital-to-analog (D/A) convertor 302 converts the digital signal of the amplitude modulation waveform to an analog signal. The analog signal of the amplitude modulation waveform based on the waveform table 301 and the RF reference frequency signal are added up by a mixer 304. Due to this addition, an RF signal subjected to amplitude modulation of the waveform table 301 is generated. The signal is irradiated by the coil 305 to generate an RF magnetic field.

Figure 4:
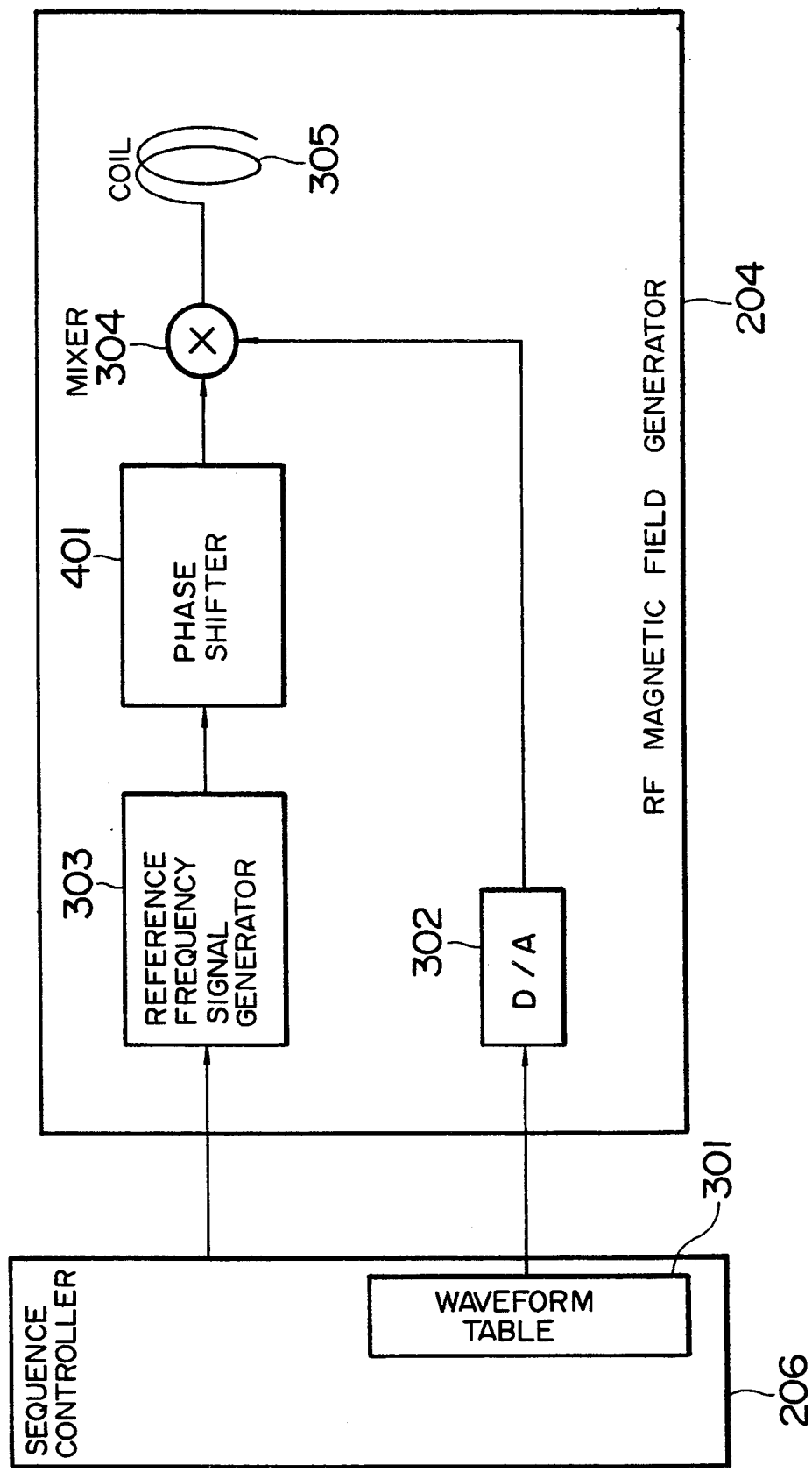
FIG. 4 is a structural view of an RF magnetic field generator having a phase shift function.

The RF magnetic field generator shown in FIG. 4 additionally includes a phase shifter 401 for freely controlling the phase of the RF reference frequency signal generator 303. In other words, means for freely controlling the phase of the RF magnetic field is added to the function of the RF magnetic field generator shown in FIG. 3.

Figure 5:
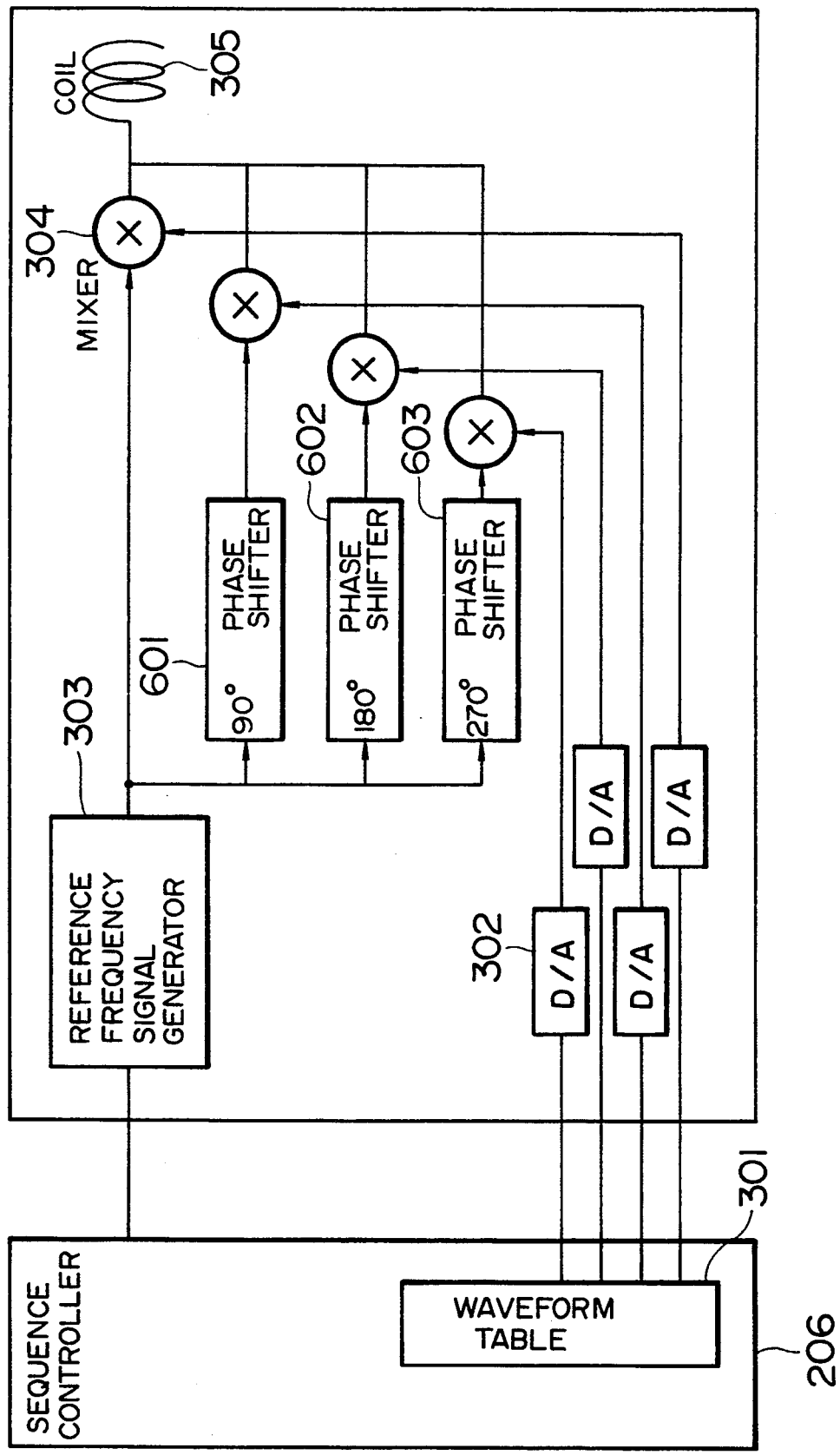
FIG. 5 is a structural view of an RF magnetic field generator having a QD signal generation function.

FIG. 5 is a structural view of an RF magnetic field generator having a QD signal generation function. To generate a QD signal, one reference frequency generator 303 is divided into four reference frequency signals, which are provided with phases of 0°, 90°, 180° and 270° respectively These phases are provided by 0° phase shifter, 90° phase shifter 601, 180° phase shifter 602 and 270° phase shifter 603. The reference frequency signal of each phase is independently amplitude-modulated by the mixer 304 on the basis of the waveform table 301. The four reference frequency signals having these phases are amplitude-modulated independently of one another and are again synthesized. There are thus generated the QD signals in which the signals having the 0° and 180° phases correspond to REAL signals and the signals having the 90° and 270° phases correspond to IMAG signals. These signals are irradiated by the coil 305. There is thus generated the RF magnetic field of QD in which the REAL and IMAG signals have independent amplitude modulation.

Figure 6:
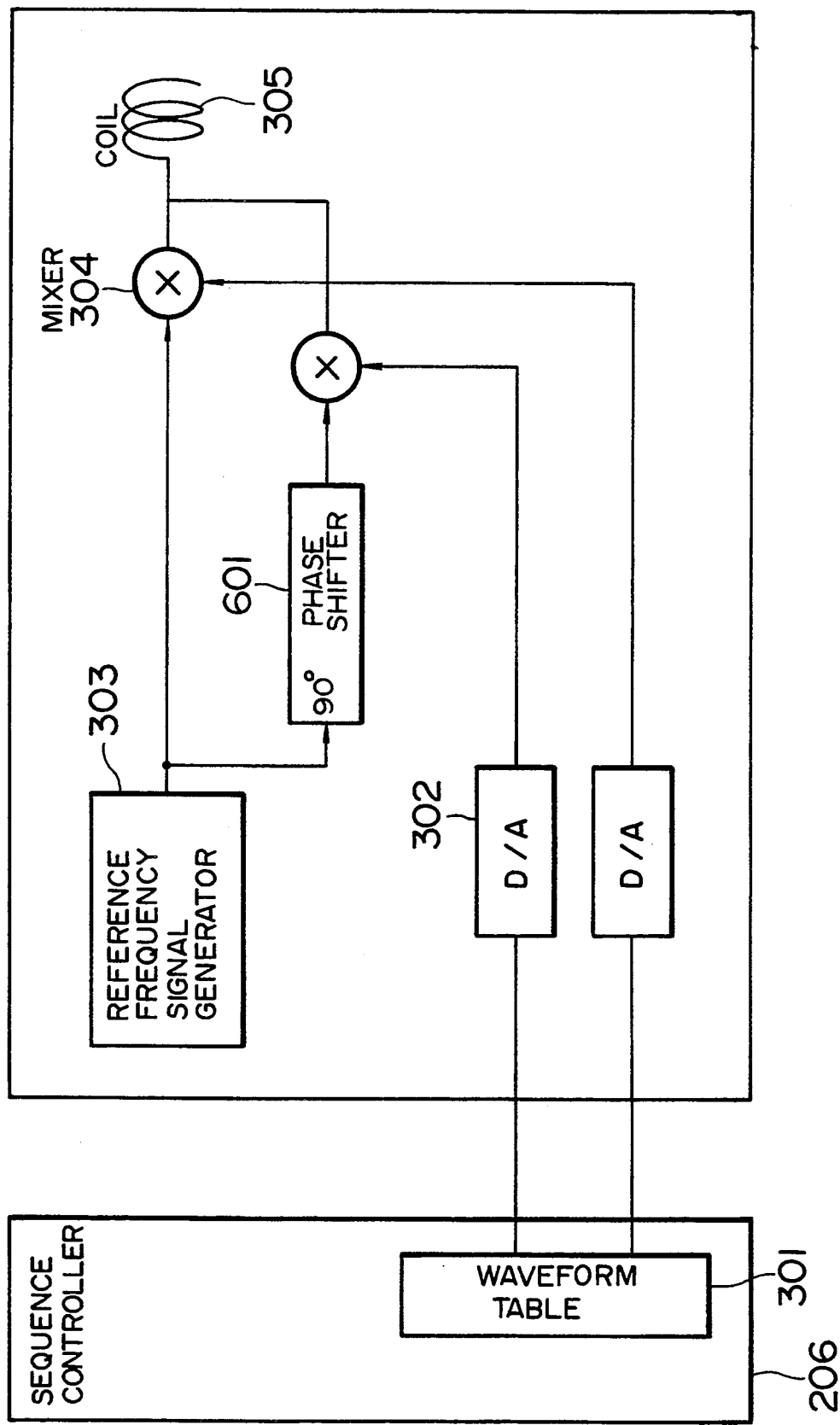
FIG. 6 is a structural view of an RF magnetic field generator having a simplified QD signal generation function.

FIG. 6 is a structural view of an RF magnetic field generator having the QD signal generation function equivalent to that of the RF magnetic field generator shown in FIG. 5. A reference frequency signal having a 90° phase shift and a reference frequency signal having a 180° phase shift are different only in their polarities and only one of them will suffice. Similarly, only one of them will suffice for 0° and 180°. Accordingly, the same function can be accomplished by only 0° and 90° as shown in FIG. 6.

(3) Relation of RF Magnetic Field Generator of Each Type:

The RF magnetic field generators shown in FIGS. 3 to 6 have upper compatibility as described below. First, the RF magnetic field generator having the phase shift function of FIG. 4 becomes the RF magnetic field generator shown in FIG. 3 if the phase shifter 401 is not used. The RF magnetic field generator having the QD signal generation function of FIG. 5 can accomplish the same function as that of the phase shifter 401 if the amplitude modulation waveform applied to the reference frequency signal of each phase is made the same and the intensity of each of them is suitably adjusted. Therefore, this RF magnetic field generator can replace the RF magnetic field generator having the phase shift function of FIG. 4. The RF magnetic field generator shown in FIG. 6 has the equivalent function to the RF magnetic field generator as described in the paragraph (2). Accordingly, the RF magnetic field generator shown in FIG. 4 can be used as the RF magnetic field generator of FIG. 3, and the RF magnetic field generators shown in FIGS. 5 and 6 can be used in place of the RF magnetic field generators shown in FIGS. 4 and 3.

(4) Type of RF Magnetic Field Generator 204 Utilized in the Present Invention:

The present invention provides means which can make double-slice imaging even by the use of the RF magnetic field generator shown in FIG. 3. Therefore, the present invention assumes the use of the RF magnetic field generator shown in FIG. 3, but it can utilize also the RF magnetic field generators shown in FIGS. 4, 5 and 6 as can be understood from the explanation given in the paragraph (3). Furthermore, the present invention can utilize those RF magnetic field generators which can accomplish the function equivalent to that of the RF magnetic field generator shown in FIG. 3, besides the RF magnetic field generators shown in FIGS. 3 to 6. In the RF magnetic field generators shown in FIGS. 3 to 6, a single coil is illustrated as the coil 305 by way of example, but the present invention can be likewise applied to the case where two orthogonal coils are used as the QD coil.

Figure 7:
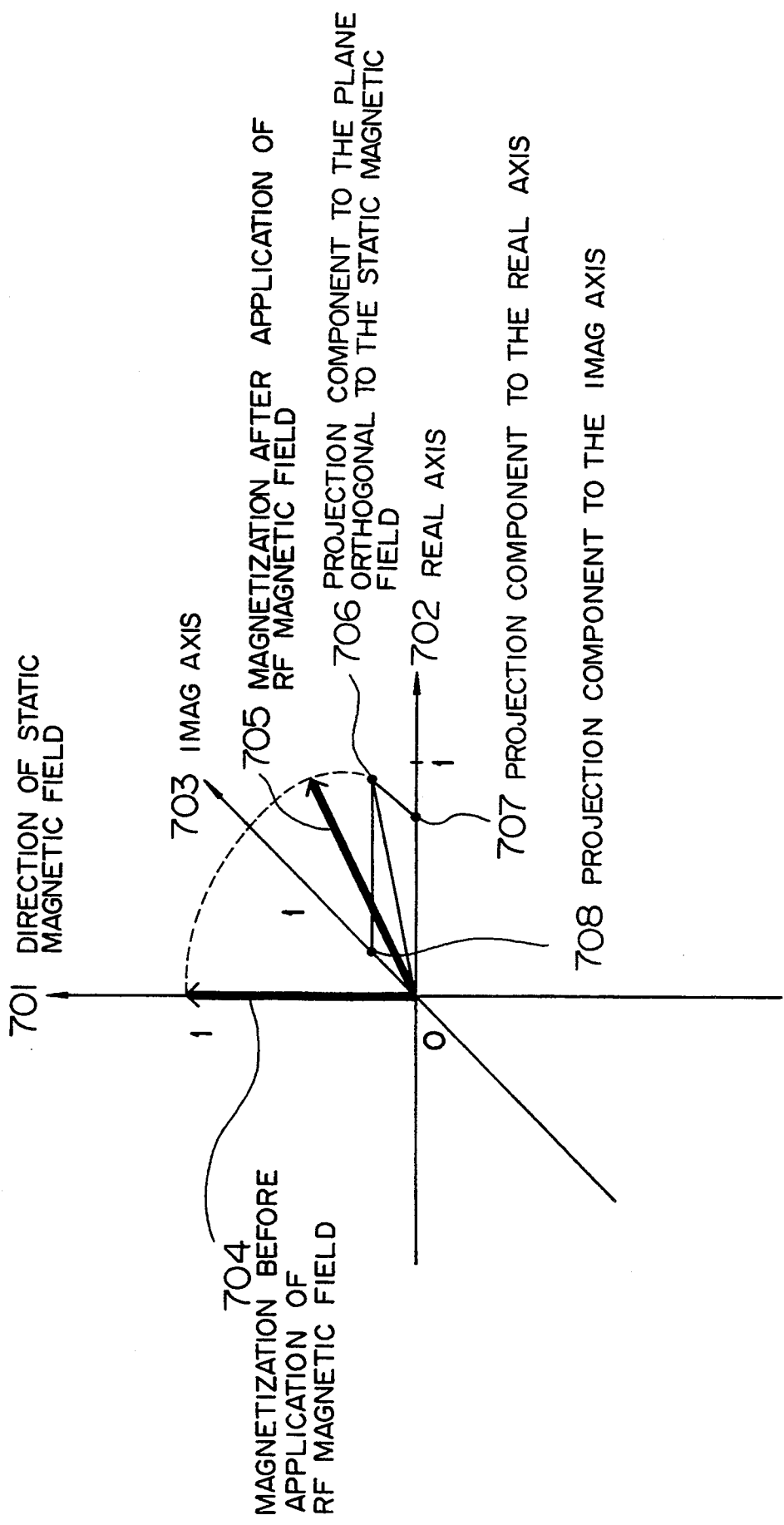
FIG. 7 is a diagram showing the state of magnetization before and after application of an RF magnetic field and its expression method.

(5) Characteristics of Magnetization and Excitation of Magnetization due to RF Magnetic Field (general explanation and definition of symbols):

The magnetization occurring in the inspection object 201 due to the static magnetic field has characteristics such that it undergoes resonance excitation by electromagnetic perturbation of the RF magnetic field and generates an electromagnetic wave. The characteristics of the magnetization are very important for imaging in a NMR imaging apparatus. The double-slice imaging method of the present invention also utilizes the properties and characteristics of the magnetization described above. In order to have the explanation of the embodiments of the present invention more easily understood, the properties of magnetization will be explained and then, the mode of excitation of the magnetization by the RF magnetic field will be described with reference to FIG. 7. Furthermore, the definition of symbols used herein will be given.

(5-1) Magnetic Field and Magnetization:

The magnetization has an inherent number of rotary oscillations which is proportional to the intensity of the static magnetic field and the sum of the intensity of the gradient magnetic field and an external magnetic field. The axis of rotation exists in the direction of the external magnetic field. Since the static magnetic field and the gradient magnetic field face in the same direction, the axis of rotation exists in the direction 701 of the static magnetic field. The static magnetic field is a homogeneous magnetic field without depending on the place but the intensity of the gradient magnetic field changes linearly depending on the position. Accordingly, the magnetization having the number of rotary oscillations which is proportional to the external magnetic field comes to possess a number of rotary oscillations in accordance with the position depending on the gradient magnetic field.

(5-2) Slice Selective Excitation:

Before the RF magnetic field is applied, the magnetization 704 faces the direction 701 of the static magnetic field as the axis of rotation. When the number of oscillations of the magnetization is contained in the zone of the number of oscillations of the RF magnetic field, the magnetization resonates with the RF magnetic field and changes its direction upon the application of the RF magnetic field. When the number of oscillations of the magnetization is not contained in the zone of the RF magnetic field, the number of oscillations of the magnetization changes with the position, so that only the magnetization at the position corresponding to the zone of the number of oscillations of the RF magnetic field is selected and excited. Since its excitation is exactly slice-like, this excitation is referred to as "slice selective excitation". The position and shape of the slice excited are determined by the gradient magnetic field and the mode of the band of the number of oscillations of the RF magnetic field. Particularly, it can be said that the main factor for the selection and shape of the slice is the Fourier component itself of the RF magnetic field.

(5-3) Mode of Excitation of Magnetization and Its Expression:

When the magnetization resonates and changes its direction, the magnetization 705 after the application of the RF magnetic field has a projection component 706 on a plane crossing orthogonally the static magnetic field. The projection component 706 to the plane crossing orthogonally with respect to the static magnetic field determines the emission intensity and phase of the electromagnetic wave. A REAL axis 702 and an IMAG axis 703 are prepared to represent positions inside the plane crossing orthogonally with the static magnetic field. A projection component 707 to the REAL axis and a projection component 708 to the IMAG axis can thus be obtained. The angle which a projection component 706 describes with the REAL axis 702 and the plane of the magnetization crossing orthogonally with the static magnetic field will be referred to as the "phase of the magnetization". The mode of determination of the REAL axis 702 and the IMAG axis 703 is arbitrary, but a system of a rotations axis is used hereby. The number of rotation of the system of rotating axis is the number of rotary oscillation of the magnetization due to the static magnetic field. The acting direction of the projection component to the plane of magnetization orthogonal to the static field with reference to the case where the magnetization resonates with the RF magnetic field with the absence of the gradient magnetic field is set to the REAL axis 702.

The intensity of the electromagnetic wave emitted by the magnetization after it resonates and then enters the excitation state is proportional to the absolute value of the projection component 706 to the plane orthogonal to the static magnetic field. The phase of the electromagnetic field is determined by the phase of the magnetization, that is, by the angle between the projection component 706 to the plane orthogonal to the static field and the REAL axis 702.

(5-4) Slice Profile:

A slice profile is introduced in order to express the mode in which the RF magnetic field selectively excites the slice. The magnetization is uniformly aligned in the direction of the gradient magnetic field, and the magnitude of the magnetization at each position is assumed to be 1. The gradient magnetic field and the RF magnetic field are applied and furthermore, the gradient magnetic field the intensity of which is inversed is applied for the half period of the application time of the RF magnetic field. The magnetization which resonates with the RF magnetic field and changes its direction and the magnetization which does not resonate and change its direction appear, depending on the position. The projection component 706 to the plane of the magnetization orthogonal to the static magnetic field is determined at each position. This is referred to as a "slice profile". This profile represents the mode of outgoing electromagnetic waves at each position when a homogeneous object exists. It can be determined either experimentally or by simulation. The slice profile corresponds to complex numbers plotted on a unidimensional axis, because the projection component 706 to the plane orthogonal to the static magnetic field has its components on both the REAL axis 702 and the IMAG axis 703. However, since it is difficult to express the complex numbers on the unidimensional axis, expression is sometimes made by separating the profile into the absolute value and the phase.

(6) Summary of the Present Invention:

The NMR imaging apparatus utilizes the NMR phenomenon and obtains a density distribution image of a magnetization, etc., by calculation by measuring the electromagnetic waves generated when the magnetization of the portion undergoing magnetic resonance enters the excitation state. Double-slice imaging according to the present invention obtains two separate slice images by simultaneously exciting two slices and calculating the images from two kinds of signal data having different modes of excitation. The gist of the present invention lies in that two slices are excited simultaneously and moreover, how two different kinds of excitation are carried out. Hereinafter, the summary of the invention will be explained with reference to FIG. 1.

(6-1) COS Wave and SIN Wave:

FIG. 1 shows a slice profile 102 obtained when the RF magnetic field subjected to the amplitude modulation on the basis of the RF magnetic field waveform 101 is applied. The slice profile 102 is closely associated with the Fourier Component of the RF magnetic field, that is, the Fourier component of the RF magnetic field waveform 101. The RF magnetic field waveform 101 mainly having the Fourier COS components is hereby referred to as the "COS waveform" 103 and the RF magnetic field waveform 101 mainly having the Fourier SIN components as the "SIN waveform" 105. The RF magnetic field receiving the amplitude modulation by the COS waveform 103 has the Fourier component of the COS component and the RF magnetic field receiving the amplitude modulation by the SIN waveform 105 has the Fourier component of the SIN component. The slice profiles that are obtained by these RF magnetic fields will be referred to as a "profile 104 of the COS wave" and a "profile 106 of the SIN wave", respectively. One of the characterizing features of the present invention is that these COS waveform 103 and SIN waveform 105 are generated, and the difference of the slice profiles when the RF magnetic fields of both waveforms are applied accomplishes double-slice imaging.

(6-2) Principle (Unidimensional):

The explanation will be given only about the unidimensional direction of the slice directions in order to have the principle of double-slice imaging of the invention more easily understood.

To begin with, the definition of symbols will be given.

z: coordinates of slice direction $\rho(z)$: density of magnetization of object to be imaged PC(z): slice profile of COS wave PS(z): slice profile of SIN wave S1: absolute value of signal generated from one of slices of object for double-slice imaging S2: absolute value of signal generated from the other slice The RF magnetic field amplitude-modulated by the COS waveform 103 simultaneously excites the two slice portions in the REAL direction. Therefore, the resulting signal data a can be expressed by the following equation (1):

$$a = \int dz[PC(z) \cdot \rho(z)] \qquad (1)$$
$$= S1 + S2$$

where the integration range is $-\infty$ to $\infty$.

The RF magnetic field amplitude-modulated by the SIN wave 105 simultaneously excites the two slice portions in mutually opposite polarities in the IMAG direction. Accordingly, the resulting signal data b can be expressed by the following equation (2):

$$b = \int dz[PS(z) \cdot \rho(z)] \qquad (2)$$
$$= i \cdot S1 - i \cdot S2$$

where the integration range is $-\infty$ to $\infty$.

The following equations (3) and (4) can be derived from equations (1) and (2):

$$S1 = (a - i \cdot b)/2 \qquad (3)$$

where i is an imaginary number unit.

$$S2 = (a + i \cdot b)/2 \qquad (4)$$

The above represents that the signal data of the respective slices can be obtained by calculation from two kinds of signal data obtained by simultaneously exciting two slices and observing them, though this represents the case of the unidimensional direction.

Next, the content described above will be put in order with the primary emphasis on the slice profiles in order to prepare the explanation about the three-dimensional case.

From Eqs. (1) and (2), Eq. (3) can be expressed as follows:

$$S1 = \int dz[PC(z) \cdot \rho(z)] - i \cdot \int dz[PS(z) \cdot \rho(z)] \qquad (5)$$
$$= \int dz[\{PC(z) - i \cdot PS(z)\} \cdot \rho(z)]$$
$$= \int dz[P1(z) \cdot \rho(z)]$$

where the integration range is $-\infty$ to $\infty$.

Here, P1(z) represents one of the slice profiles separated by calculation.

Eq. (5) represents that the signal data as if measured by the slice profile of P1(z) can be obtained by calculation on the basis of the signal data measured by the slice profiles of PC(z) and PS(z).

Similarly, Eq. (4) can be expressed as follows from Eqs. (1) and (2):

$$S2 = \int dz[PC(z) \cdot \rho(z)] + i \cdot \int dz[PS(z) \cdot \rho(z)] \quad (6)$$
$$= \int dz[\{PC(z) + i \cdot PS(z)\} \cdot \rho(z)]$$
$$= \int dz[P2(z) \cdot \rho(z)]$$

where the integration range is $-\infty$ to $\infty$.

Here, P2(z) is the other profile separated by calculation.

Similarly, Eq. (6) represents that the signal data as if measured by the slice profile PS(z) can be obtained by calculation from the signal data measured by the slice profiles of PC(z) and PS(z).

(6-3) Principle (Three-Dimensional):

hereinafter, the principle of double-slice imaging of the present invention will be explained.

To begin with, the definition of symbols will be given.

x, y: directions of imaging plane z: slice direction $\rho(x,y,z)$: density of magnetization of object to be imaged PC(z): slice profile 104 of COS wave PS(z): slice profile 105 of CIN wave F: operator prepresenting the operations in x and y directions to be applied to magnetization at the time of imaging G: operator representing calculation when image is reconstructed from signal data.

The operator F representing the operations to be applied to the magnetization depends on the way of imaging. In imaging using ordinary two-dimensional Fourier transform, F is an operation corresponding to two-dimensional inverse Fourier transform. The operator G representing the image reconstruction calculation is preferably an inverse calculation of the operation of adding the magnetization. In the case of imaging using the ordinary two-dimensional Fourier transform, F is an inverse Fourier transform and hence, G is a Fourier transform. Accordingly, G·F can be regarded as 1.

The measurement data A imaged by the use of the RF magnetic field amplitude-modulated by the COS waveform 103 and the measurement data B imaged by the use of the RF magnetic field amplitude-modulated by the SIN waveform 105 can be expressed as follows:

$$A = F \cdot \int dz[PC(z) \cdot \rho(x,y,z)] \quad (7)$$

where the integration range is $-\infty$ to $\infty$.

$$B = F \cdot \int dz[PC(z) \cdot \rho(x,y,z)] \quad (8)$$

where the integration range is $-\infty$ to $\infty$.

From Eqs. (7) and (8), the following equations (9) and (10) can be obtained:

$$A - i \cdot B = F \cdot \int dz[\{PC(z) - i \cdot PS(z)\} \cdot \rho(x,z,z)] \quad (9)$$
$$= F \cdot \int dz[P1(z) \cdot \rho(x,y,z)]$$
$$= F \cdot S1(x,y)$$

where the integration range is $-\infty$ to $\infty$.

P1(z) is the slice profile of one of the slices separated by the calculation and S1(x, y) is a signal distribution generated from its slice surface.

$$A + i \cdot B = F \cdot \int dz[\{PC(z) + i \cdot PS(z)\} \cdot \rho(x,z,z)] \quad (10)$$
$$= F \cdot \int dz[P2(z) \cdot \rho(x,y,z)]$$
$$= F \cdot S2(x,y)$$

where the integration range is $-\infty$ to $\infty$.

P2(z) is the slice profile of the other slice separated by the calculation and S2(x, y) is a signal distribution generated from its slice surface.

The signal distribution generated from each slice can be derived as follows from Eqs. (9) and (10):

$$G \cdot \{A - i \cdot B\} = G \cdot F \cdot S1(x,y) \quad (11)$$
$$= S1(x,y)$$

$$G \cdot \{A + i \cdot B\} = G \cdot F \cdot S2(x,y) \quad (12)$$
$$= S2(x,y)$$

From the above, the signal distribution generated from each slice can be obtained. Incidentally, as can be understood from the following equation (13), the signal distribution generated from the slice corresponds to the density distribution of the magnetization inside the slice, that is, the density distribution of the magnetization of the slice surface obtained by the projection in the slice direction. In the manner described above, an image representing the density distribution of the magnetization by projecting the magnetization in each slide in the slice direction can be obtained.

$$S1(z) = \int dz[P1(z) \cdot \rho(x,y,z)] \quad (13)$$

(7) Procedures:

The execution procedures of the first embodiment of the present invention will be described briefly.

Figure 17:
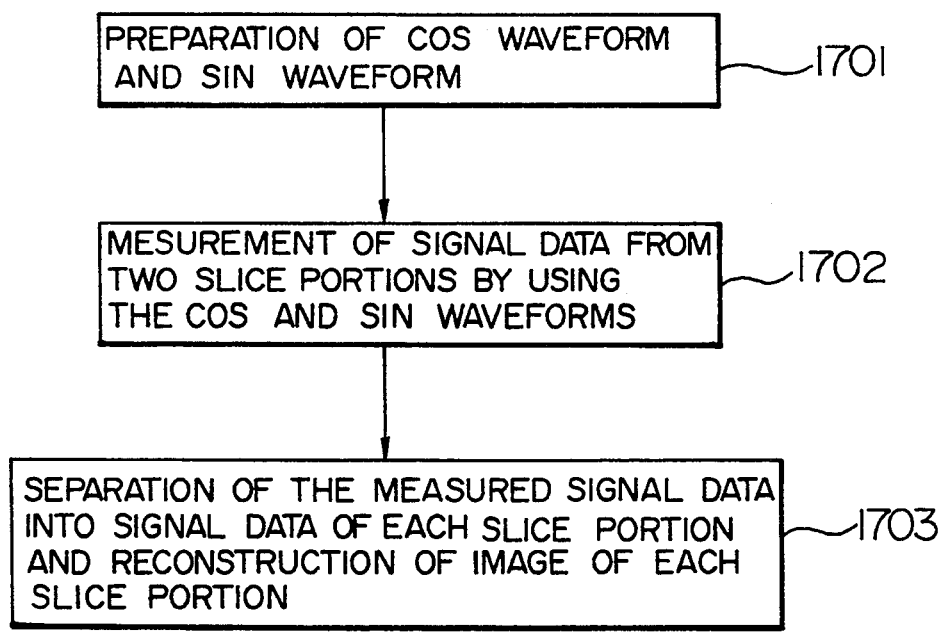
FIG. 17 is a flow diagram of the present invention.

FIG. 17 shows a flow diagram of the present invention. At step 1701, the COS waveform and SIN waveform are prepared. At step 1702, signal data from two slice portions are measured by using the COS and SIN waveforms. The measured signal data comprises two kinds of signal data each of which corresponds to each slice portion. At step 1703, the two kinds of signal data are separated from the measured signal data and an image of each slice portion is reconstructed.

Detailed operations are explained in the paragraphs (7-1), (7-2) and (7-3).

(7-1) Preparation of the COS waveform and the SIN waveform:

There are provided means for generating an RF magnetic field mainly having a Fourier COS components and means for generating an RF magnetic field mainly having Fourier SIN components. Method of Materialization:

The structures of the RF magnetic field generators for generating the RF magnetic field and their various types have already been described in the paragraphs (2), (3) and (4). The RF magnetic field generator shown in FIG. 3 will be hereby employed. As described in the paragraph (6-1), the COS waveform 103 and the SIN waveform 105 shown in FIG. 1 are put into the waveform table shown in FIG. 3. The RF magnetic field described above can be obtained by carrying out amplitude modulation by referring to the respective waveforms, whenever necessary. The definite method of generating the COS waveform 103 and the SIN waveform 105 will be described later in a paragraph (9).

(7-2) Measurement:

Two kinds of signal data, that is, the signal data measured by the use of the RF magnetic field mainly having the Fourier COS components and the signal data measured by the use of the RF magnetic field mainly having the SIN components are obtained. Method of Materialization:

The imaging sequence for representing the operation of each instrument necessary for obtaining the measuring data described in the paragraphs (7) and (8) of the paragraph (6-3) will be later described in the paragraph (8).

(7-3) Separation and reconstruction:

The two kinds of signal data are separated by calculating the Eqs. (9) and (10) in the paragraph (6-3).

The image of the each slice portion is reconstructed by the Eqs. (11) and (12) in the paragraph (6-3).

(8) Imaging Sequence:

The way of operating each instrument at the time of imaging is referred to as the "imaging sequence". A large number of imaging sequences exist for representing the ways of operating a definite instrument. Examples are a spin echo method, a gradient echo method, an IR method, and so forth. The present invention can be applied to any of these methods. The gradient echo method and the spin echo method will be explained as the typical examples.

Figure 8:
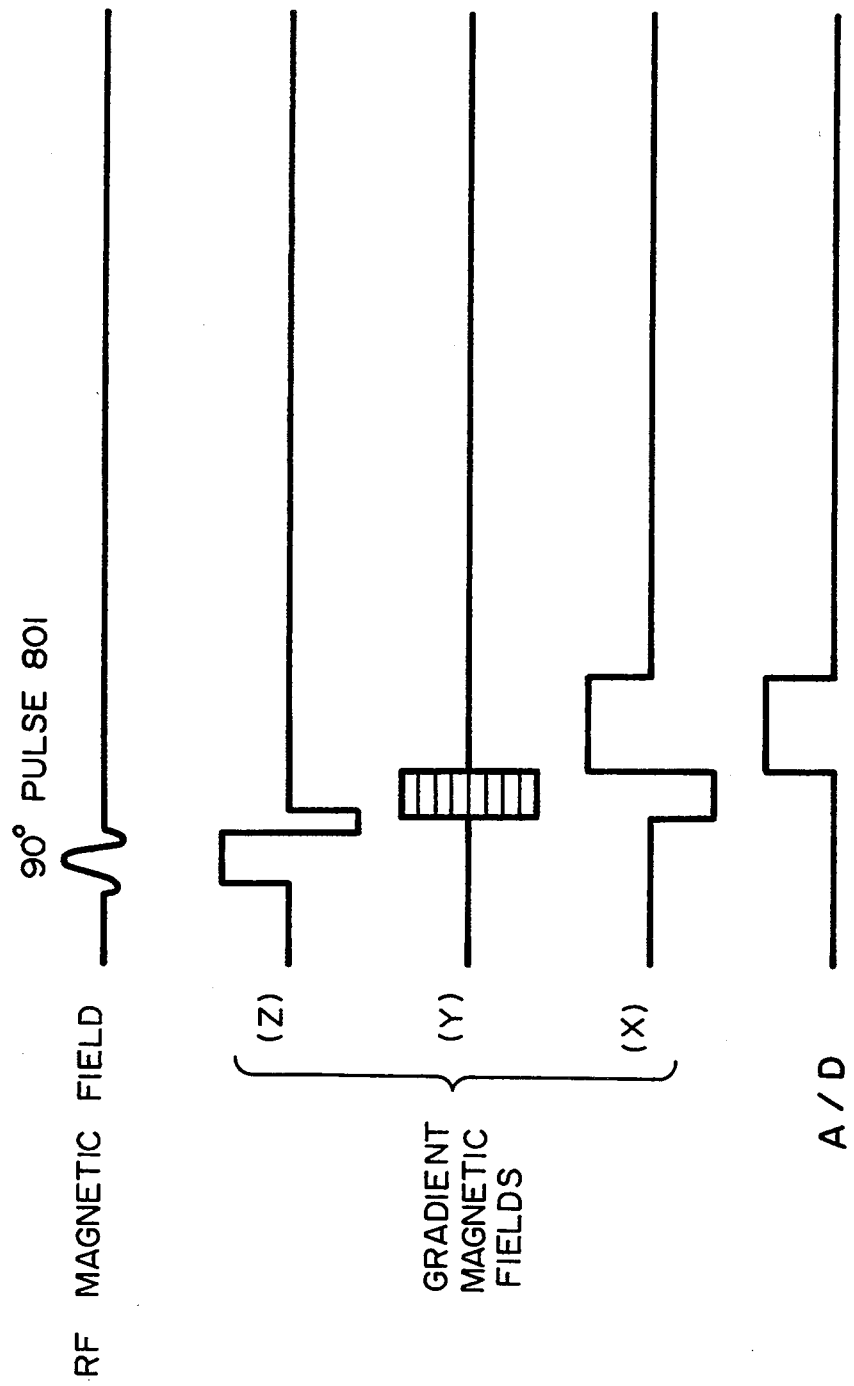
FIG. 8 is a diagram showing examples of sequences of a gradient echo method.

A large number of imaging sequences representing definite operations also exist for the gradient echo method. FIG. 8 shows the most simplified case. In the sequence shown in FIG. 8, slice selection in the Z direction is carried out by applying a gradient magnetic field in the Z direction in combination with a 90° pulse, and after a gradient magnetic field in the Y direction is applied, data measurement is carried out by forming a gradient echo signal by the gradient field in the X direction. This procedure is repeated a predetermined number of times. In each iteration, the intensity of the gradient magnetic field in the Y direction is changed by a predetermined step value every time. Signals stressing the relaxation time of a subject can be formed by selecting the iteration time interval and the time from the excitation of the magnetization by the 90° pulse to the formulation of the gradient echo signal, and images having the stressed relaxation time can be obtained. The sequence of the gradient echo method has its feature in that it images the slice image which is determined by the slice profiles of the 90° pulse.

Figure 9:
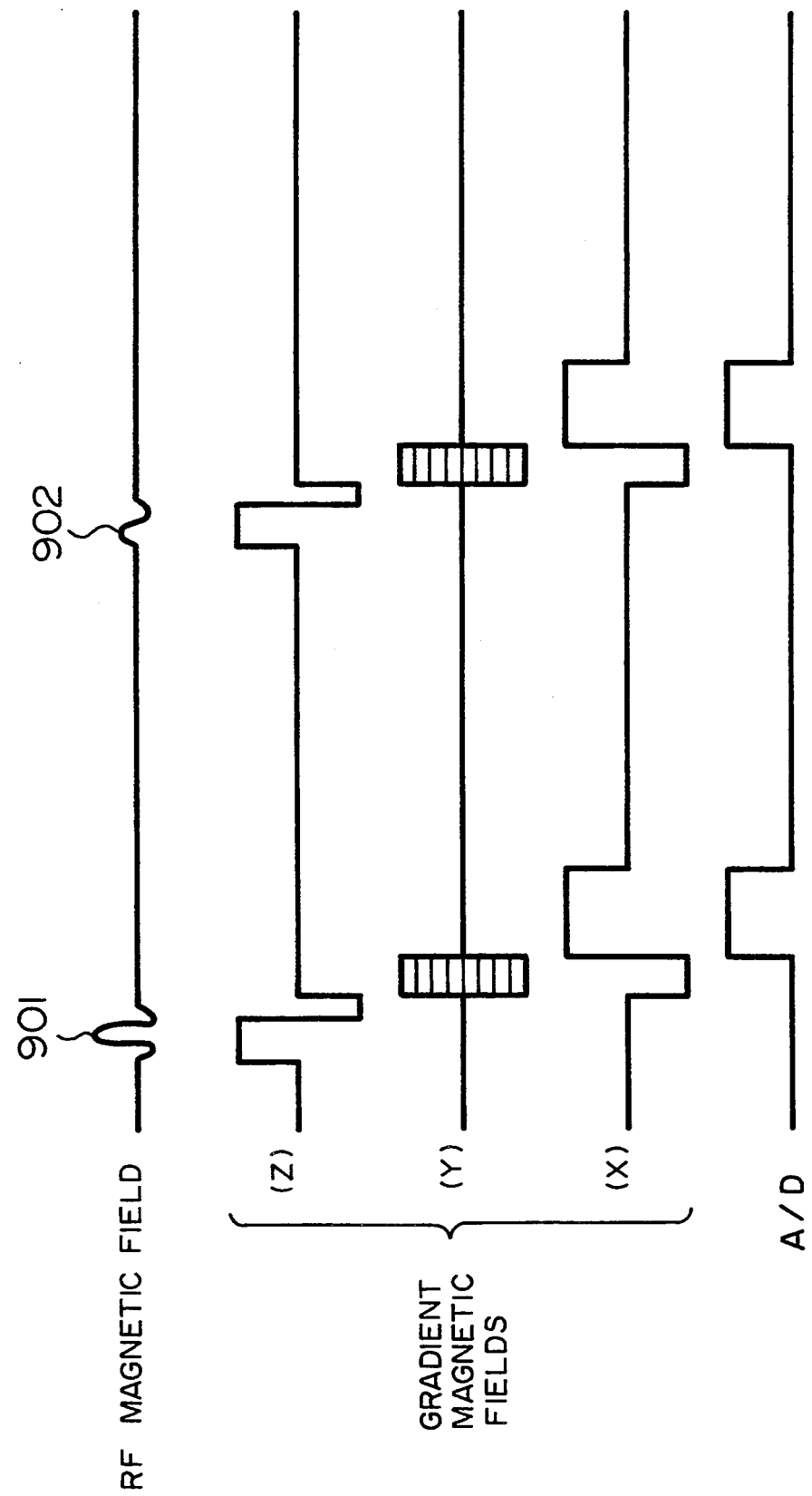
FIG. 9 is a diagram showing a sequence for accomplishing double-slice imaging by the gradient echo method.

FIG. 9 shows the sequence obtained by expanding the imaging sequence of the gradient echo method shown in FIG. 8 to double-slice imaging. A 90° pulse 901 of the COS waveform and a 90° pulse 902 of the SIN waveform are used in place of the 90° pulse 801. The rest are the same as those shown in FIG. 8. After all the signal data obtained when the 90° pulse 901 of the COS waveform are measured, imaging by the use of the 90° pulse of the SIN waveform may be carried out, or imaging may be carried out by repeating alternately the COS waveform and the SIN waveform. As the final result, the signal data that are obtained when the 90° pulse 801 shown in FIG. 8 is replaced by the 90° pulse 901 of the COS waveform and the signal data that are obtained when the 90° pulse 801 is replaced by the 90° pulse of the SIN waveform are obtained.

Besides the imaging sequence shown in FIG. 8, the imaging sequences of the gradient echo method include various others such as the one which applies a gradient magnetic field for spoil and rephase after the measurement of signals, the one which applies a gradient magnetic field for rephase before the measurement of the signals, and the one which sets the 90° pulse 801 to an angle smaller than 90°. These sequences can be expanded easily to double-slice imaging as can be understood from the examples given above. In other words, when the sequence which is obtained by adding the gradient magnetic field for spoil after measurement and for rephase before and after measurement to the sequence shown in FIG. 8 is expanded to the sequence of double-slice imaging, the sequence in which the 90° pulse 801 is replaced similarly by the 90° pulse of the COS waveform and the sequence in which the 90° pulse 801 is replaced by the 90° pulse 902 of the SIN waveform are employed. When the sequence in which the application intensity of the 90° pulse in the sequence shown in FIG. 8 is set to an angle lower than 90° is expanded to double-slice imaging, the sequence is employed in which the application intensity of each of the COS waveform and the SIN waveform is similarly lowered.

Figure 10:
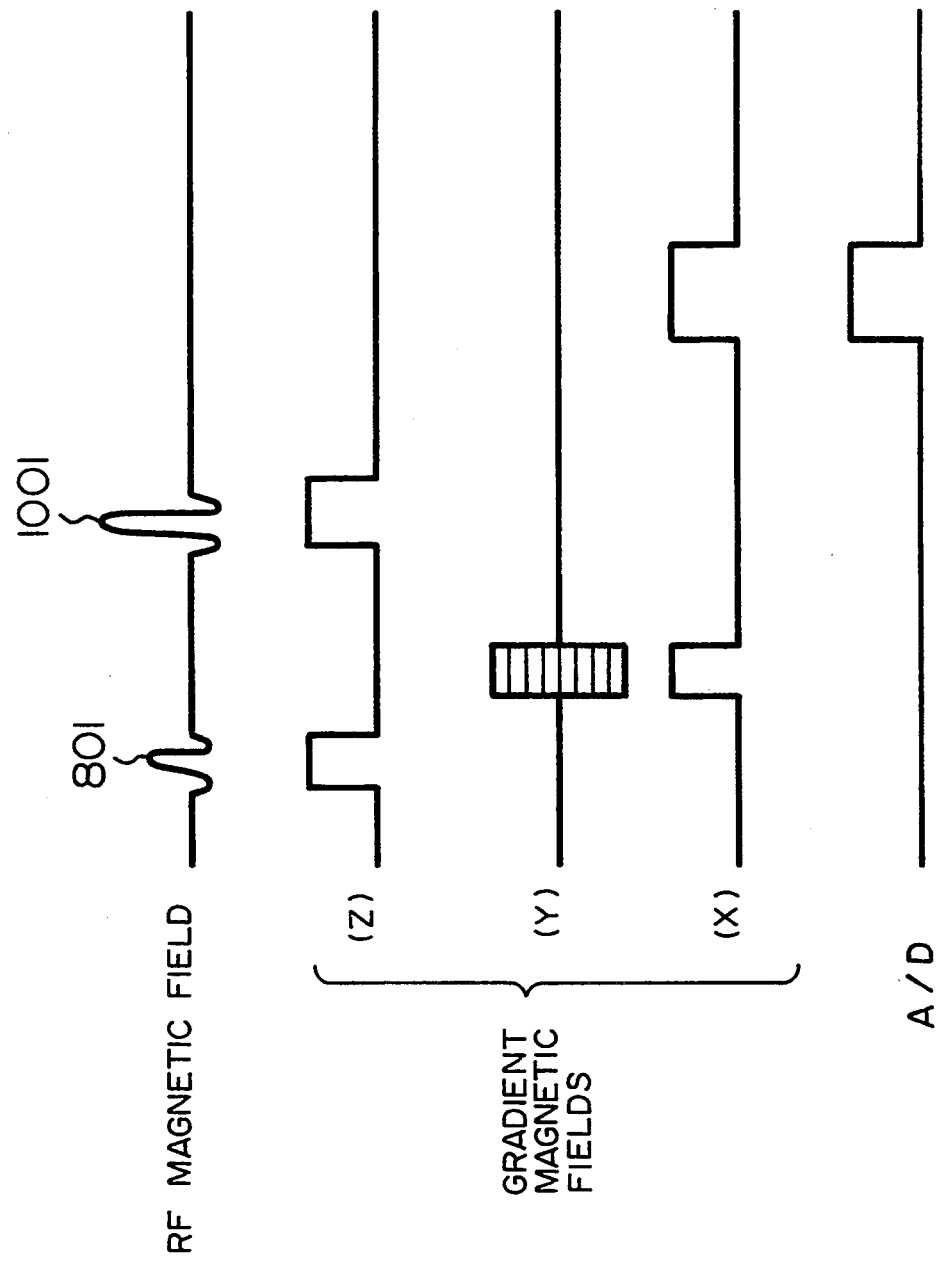
FIG. 10 is a diagram showing examples of sequences of spin echo method.

Next, the case of the spin echo method will be explained. A large number of sequences representing the definite operations exist in the echo spin method in the same way as in the gradient echo method. FIG. 10 shows the most simplified sequence. In the sequence shown in FIG. 10, the 90° pulse 801 is irradiated during the application of the gradient magnetic field in the Z direction so as to generate slice selective excitation in the Z direction, and the gradient magnetic field in the Y direction for changing the gradient magnetic field in the X direction and its intensity everytime by the same step value is applied. The 180° pulse 1001 is irradiated during the application of the gradient magnetic field in the Z direction, and the phase of the magnetization at the same portion as the portion at which slice selective excitation is generated by the 90° pulse is inversed. The gradient magnetic field is applied in the X direction to generate the spin echo signals, and in this way, the signal measurement is carried out. The measurement is repeatedly carried out a predetermined number of times by changing the intensity of the gradient magnetic field in the Y direction. An image having the stressed relaxation time of the subject can be obtained by selecting the iteration time and the time from the excitation by the 90° pulse to the start of the measurement, in the same way as in the sequence of the gradient echo method. The characterizing feature of the sequence of this spin echo method lies in that a profile having the overlap of slice selection characteristics of the 90° pulse and the slice selection characteristics by the 180° pulse can be obtained.

Figure 11:
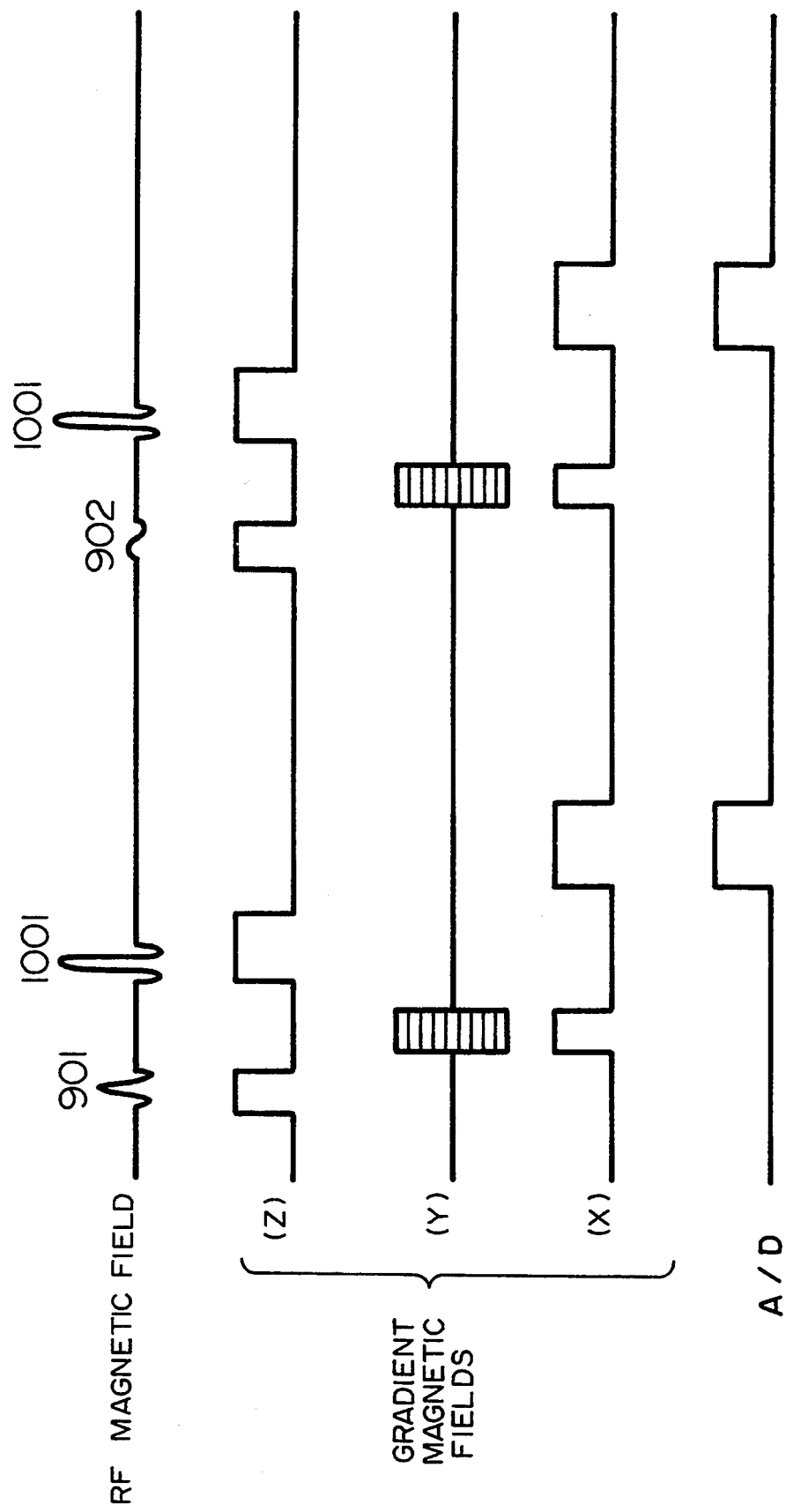
FIG. 11 is a diagram showing examples of sequences for accomplishing double-slice imaging by the spin echo method.

FIG. 11 shows the sequence obtained by expanding the spin echo sequence shown in FIG. 10 to double-slice imaging. It is the sequence in which the following two sequences overlap with each other in the same way as the gradient echo method. The first sequence uses a 90° pulse 901 of the COS waveform in place of the 90° pulse 801 and a 180° pulse for double-slice imaging in place of the 180° pulse 1001. The other sequence uses a 90° pulse 902 of the SIN waveform in place of the 90° pulse 801 and a 180° pulse for double-slice imaging in place of the 180° pulse 1001. Imaging by the other sequence may be carried out after imaging by one of the sequences is completed or these two sequences may be carried out alternately by the iteration of imaging, in the same way as in the gradient echo method. Imaging sequences of an arbitrary combination becomes possible so long as imaging data of the two sequences can be obtained finally.

There are a large number of modifications of the sequences of the spin echo method besides the sequence shown in FIG. 10. They include a multi-echo sequence in which the number of echos to be measured is increased, a method which adds a gradient magnetic field for spoil or rephase after the measurement of signals, a method which adds a gradient magnetic field for rephase before the measurement of signals, and so forth. Such sequences can be expanded easily to double-slice imaging as can be understood from the examples of the gradient echo method and the spin echo method described above. In the case of the multi-echo, similar replacement from FIG. 10 to FIG. 11 is made and the 180° pulse added afresh is replaced by a 180° pulse 1001 for double-slice imaging. In this manner, the double-slice imaging sequence can be obtained. Similarly, in the case of the sequence in which the gradient magnetic field for spoil or rephase is added after the measurement of signals or the sequence in which the gradient magnetic field for rephase is added before the measurement of signals, the double-slice imaging sequence can be obtained by replacing the 90° pulse and the 180° pulse by the pulses for double-slice imaging in the same way as the change of FIG. 10 to FIG. 11.

(9) RF Magnetic Field Waveform:

FIG. 12 shows an example of the program for generating an RF magnetic field waveform for double-slice imaging. Table 1 illustrates parameter values in the example shown in FIG. 12 which are necessary for generating the waveforms, when the COS waveform, the SIN waveform and the 180° waveform are generated. The COS waveform is an RF magnetic field waveform mainly having the Fourier COS components, and the SIN waveform is an RF magnetic field waveform mainly having the Fourier SIN components. Various combinations of parameter values may be possible if acceptance/rejection of performance of the COS waveform and the SIN waveform and their band width do not offer much problem. Tables 1 and 2 show the examples of such waveforms. Table 1 shows, as the 180° pulse waveform for double-slice imaging, the 180° waveform which is so designed as to coincide with the slice width of the COS waveform and the SIN waveform shown in Table 1. Table 2 shows other parameter examples for the COS waveform and the SIN waveform.

TABLE 1

| Waveform example 1 | COS component | | | | | SIN component | | | |
|---|---|---|---|---|---|---|---|---|---|
| | FR(0) | FR(1) | FR(2) | FR(3) | FR(4) | FI(1) | FI(2) | FI(3) | FI(4) |
| COS waveform | 90 | 90 | 45 | 0 | 0 | 0 | 0 | 0 | 0 |
| SIN waveform | 00 | 10 | 0 | 0 | 0 | 90 | 45 | 0 | 0 |
| 180° waveform | 160 | 180 | 180 | 90 | 10 | 0 | 0 | 0 | 0 |

TABLE 2

| Waveform example 1 | COS component | | | | | SIN component | | | |
|---|---|---|---|---|---|---|---|---|---|
| | FR(0) | FR(1) | FR(2) | FR(3) | FR(4) | FI(1) | FI(2) | FI(3) | FI(4) |
| 2 | | | | | | | | | |
| COS waveform | 90 | 90 | 45 | 0 | 0 | 0 | 0 | 0 | 0 |
| SIN waveform | 0 | 0 | 0 | 0 | 0 | 90 | 45 | 0 | 0 |
| 3 | | | | | | | | | |
| COS waveform | 0 | 90 | 45 | 0 | 0 | 0 | 0 | 0 | 0 |
| SIN waveform | 0 | 0 | 0 | 0 | 0 | 90 | 45 | 0 | 0 |
| 4 | | | | | | | | | |
| COS waveform | 0 | 90 | 90 | 0 | 0 | 0 | 0 | 0 | 0 |
| SIN waveform | 0 | 0 | 0 | 0 | 0 | 90 | 90 | 0 | 0 |
| 5 | | | | | | | | | |
| COS waveform | 0 | 0 | 0 | 90 | 90 | 0 | 0 | 0 | 0 |
| SIN waveform | 0 | 0 | 0 | 0 | 0 | 0 | 0 | 90 | 90 |
| 6 | | | | | | | | | |
| COS waveform | 90 | 90 | 90 | 45 | 0 | 0 | 0 | 0 | 0 |
| SIN waveform | 0 | 0 | 0 | 0 | 0 | 90 | 90 | 45 | 0 |

Figure 13:
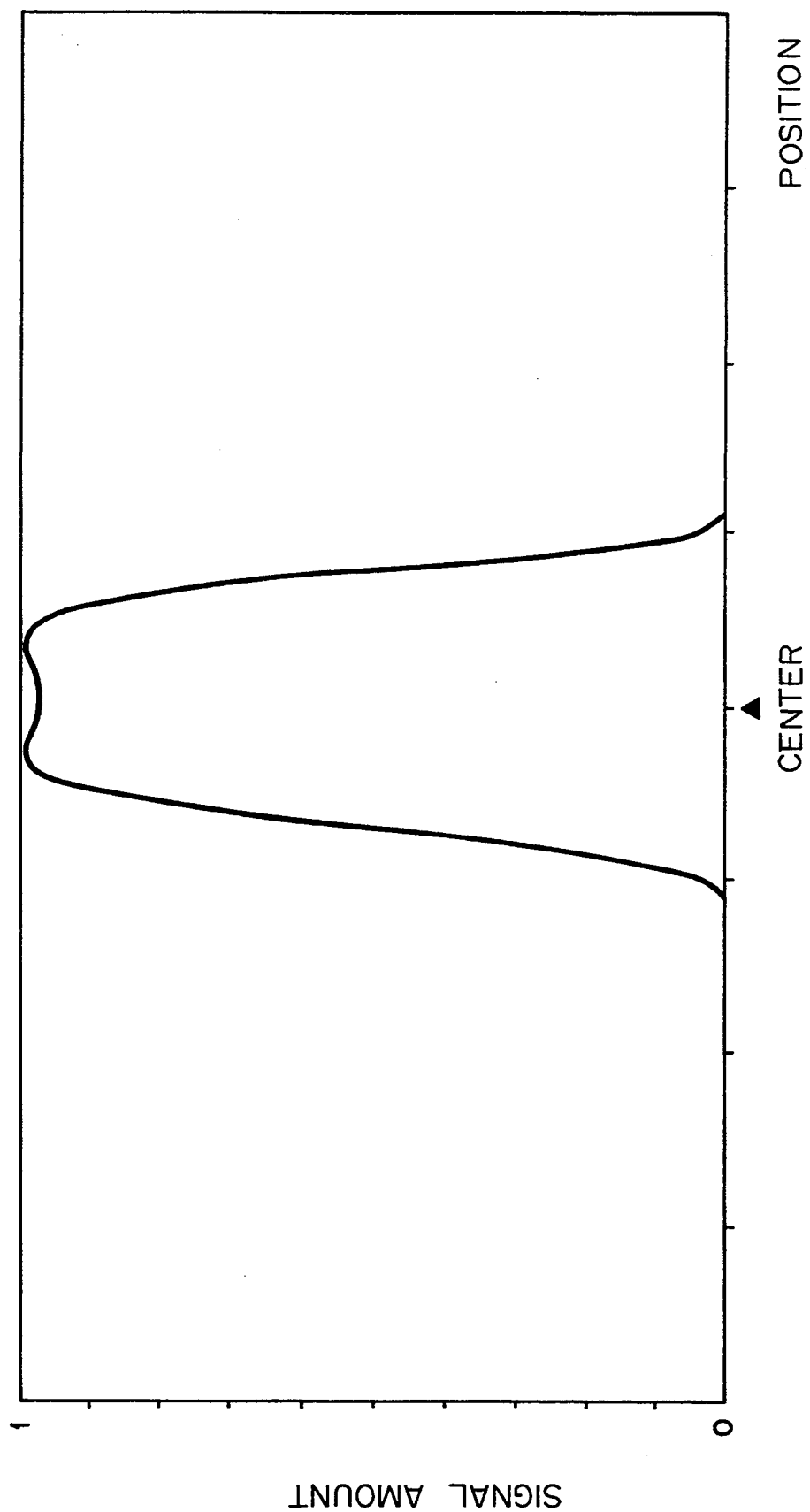
FIG. 13 is a waveform diagram showing a slice profile when a COS wave is used.
Figure 14:
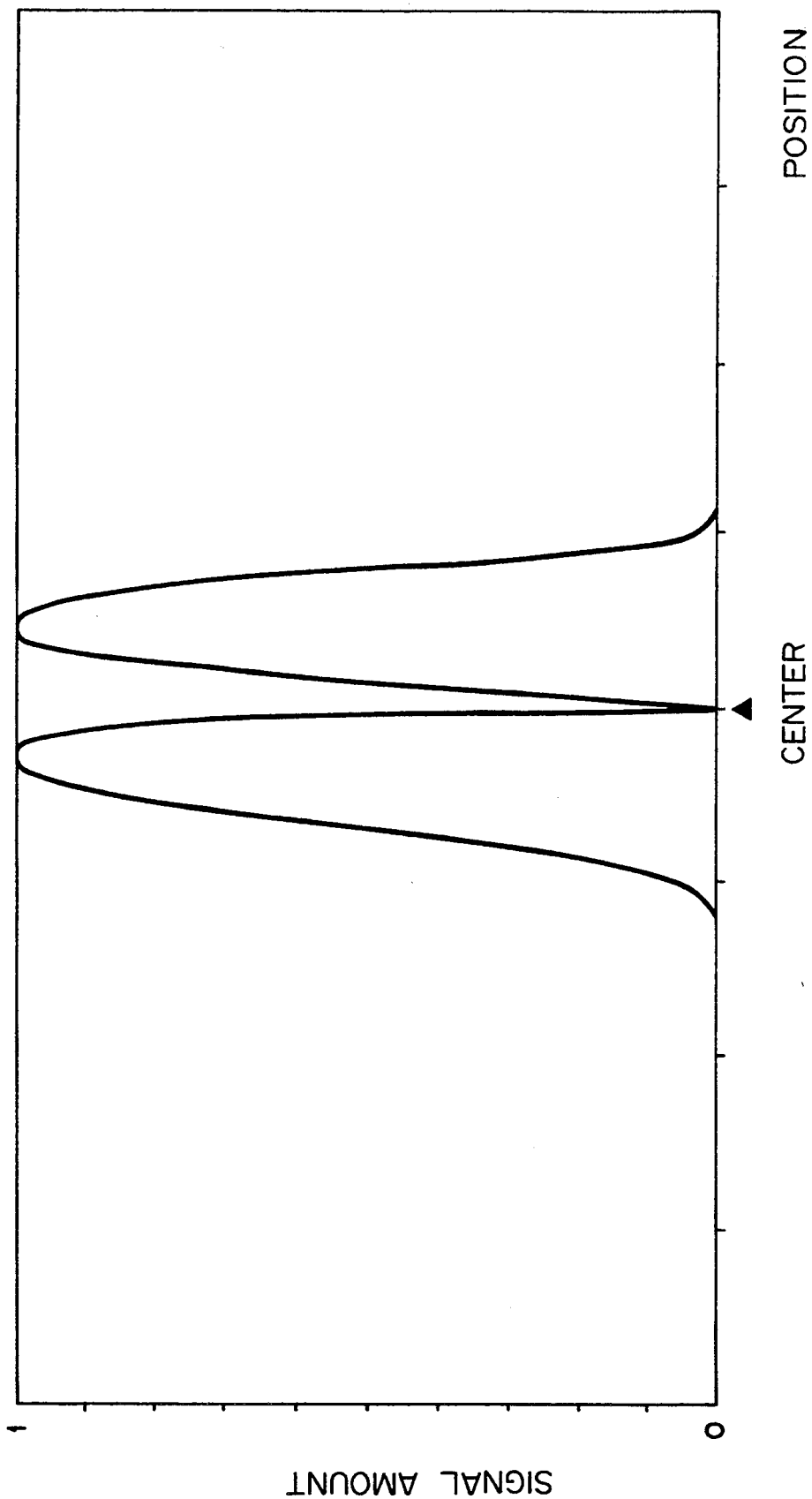
FIG. 14 is a waveform diagram showing a slice profile when a SIN wave is used.
Figure 15:
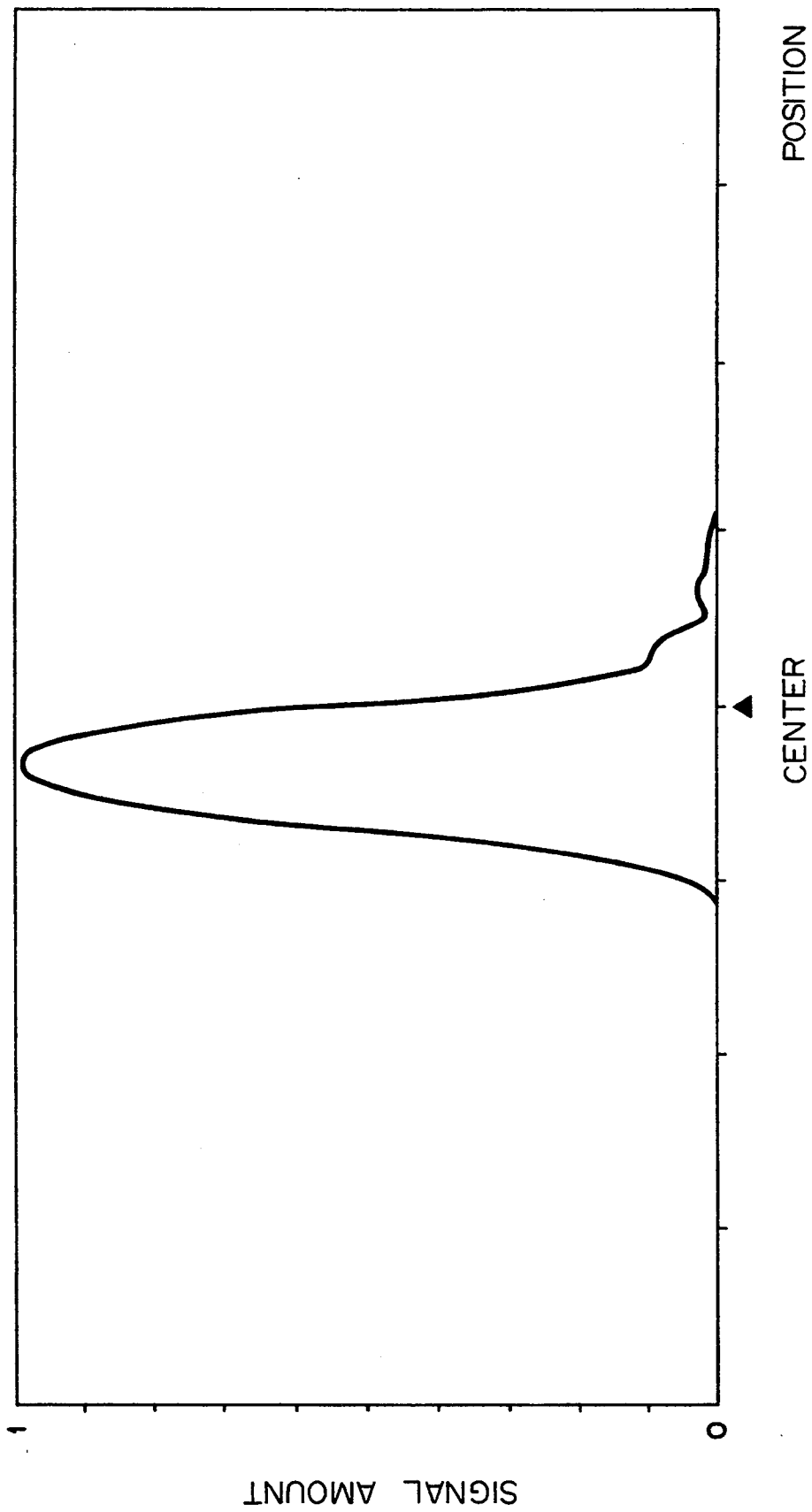
FIG. 15 is a waveform diagram showing one of the separated slice profiles.
Figure 16:
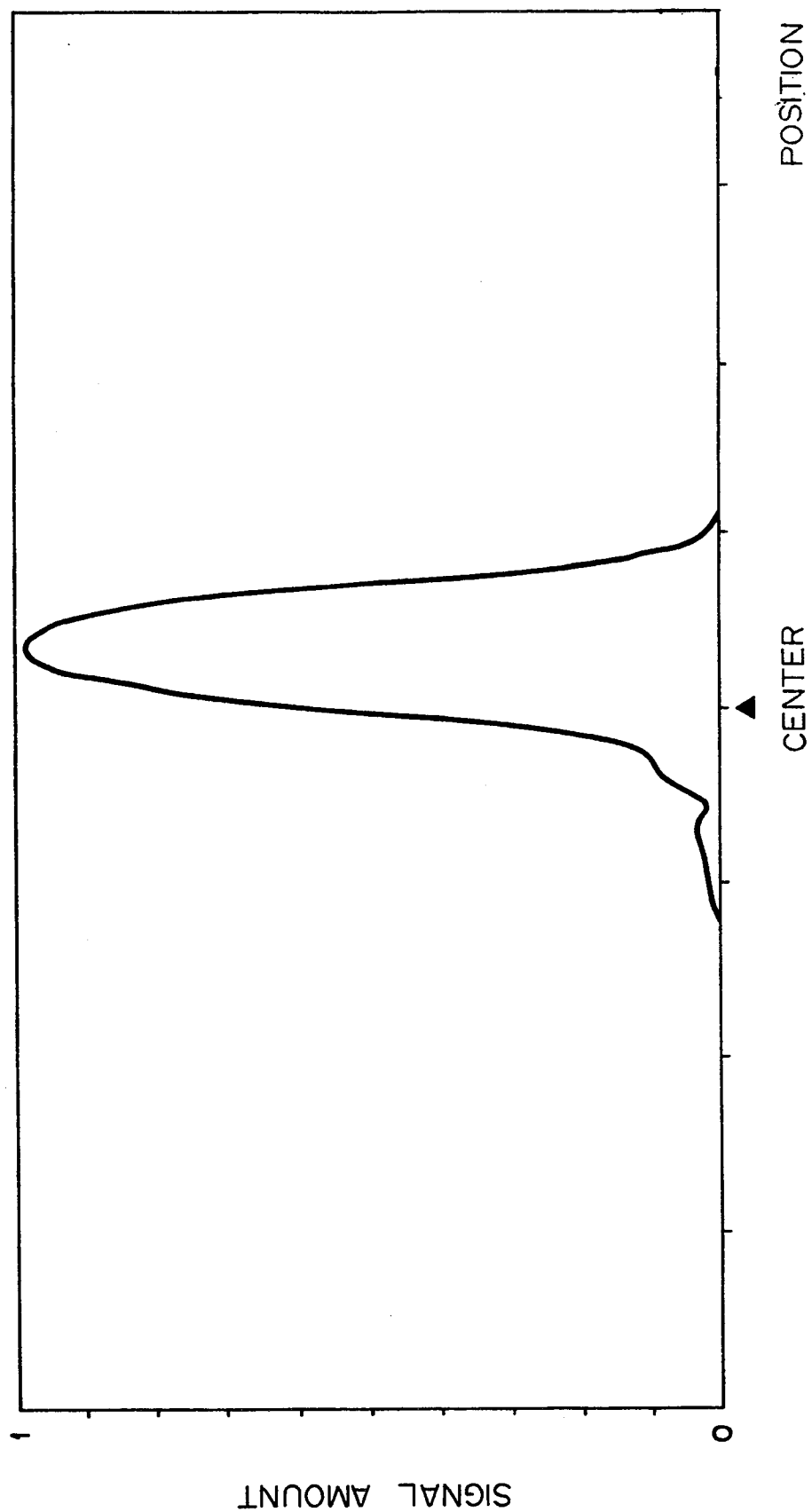
FIG. 16 is a waveform diagram showing the other of the separated slice profiles.

FIGS. 13 and 14 show the simulation results of the slice profiles obtained by the RF magnetic field waveforms generated on the basis of the parameters of Table 1. Simulation is carried out by solving the Block s equation as an equation for the magnetization. FIGS. 13 and 14 show the simulation results of the slice profiles obtained when double-slice imaging is carried out in accordance with the spin echo sequence shown in FIG. 11. Due to the spin echo, the slice profile of the 90° pulse and the slice profile of the 180° pulse are integrated with each other. FIG. 13 shows the slice profile when the 90° pulse of the COS wave is used, and only the absolute value is shown. The phases are substantially the same at the slice portion. FIG. 14 shows the slice profile in terms of only the absolute value when the 90° pulse of the SIN wave is used. The phases are deviated by $\pi$ to the right and left from the slice and are moreover deviated by $\pi/2$ and $-/2$ from the phase of the COS waveform. FIGS. 15 and 16 show the separated slice image, respectively. The separation calculation of the slice profile is carried out in accordance with $PC(z)+i\cdot PS(z)$ and $PC(z)-i\cdot PS(z)$ with $PC(z)$ and $PS(z)$ representing the profiles of FIGS. 13 and 14, respectively.

Table 2 shows the examples of the parameters of other RF magnetic field waveforms of Table 1. Only the COS waveform and the SIN waveform are shown as a pair. Numerals at the extreme left of Table 2 represent the number of the waveform examples. In comparison with the waveform example shown in Table 1, the parameter value FR(1) of the SIN waveform is somewhat different and a small difference exists in the result.

In comparison with the waveform example 2, the parameter value FR(0) of the COS waveform of the waveform example 3 is set to 0. Since the center of the slice is not excited, a gap occurs between the separated slices. In the waveform example 4, the thickness of the slice to be excited is somewhat made greater than that of the waveform example 3. In the waveform example 5, the slice gap is made greater than in the waveform example 4. In the waveform example 6, the width of the slice is made greater than in the waveform example 2.

(10) Modified Examples of the Embodiment:

The embodiment described above can be modified in various ways as illustrated below.

(10-1) Phase shift:

In the case of the RF magnetic field generator having the phase shift function shown in FIG. 4, the phase of the signal to be measured can be changed by controlling the phase of the RF magnetic field. When the phase of the RF magnetic field is deviated by $\theta$, the phase of the signal to be measured changed by $\theta$, as well. With the change of the phase of the measurement changes, the calculation for separating the slices changes, too. An example will be given. The measurement signals when the phase is not deviated are assumed to be A and B. The separation calculation at this time is $A+i\cdot B$ and $A-i\cdot B$. When, for example, the phase of one of the measurement signals B is deviated by $\pi/2$ and signal ccc $= i\cdot B$ is obtained, the separation calculation proves $A+i\cdot B = A+C$, $A-i\cdot B = A-C$.

(10-2) Synthesis of RF Magnetic Field:

There is a method which forms linear coupling of two RF magnetic field waveforms used for double-slice imaging of the embodiment described above. Hereinafter, this method will be explained using symbols.

The RF magnetic field mainly having the Fourier COS components is defined as "HS" and the impression intensity at this time is assumed to be 90°.

The RF magnetic field mainly having the Fourier SIN components is defined as "HC" and the impression intensity at this time is assumed to be 90°.

RF magnetic fields HA and HB are generated by the following synthesis.

$$HA = K\cdot HC + L\cdot HS \tag{14}$$

with the proviso that $K^2 + L^2 = 1$ $$HB = M\cdot HC = N\cdot HS \tag{15}$$

with the proviso that $M^2 + N^2 + 1$ K, L, M and N are real numbers.

The measurement signal of HA by the RF magnetic field is defined "SA" and that of HB by the RF magnetic field, "SB". The calculation formula for separating the slices at this time is as follows:

$$S1 = (n\cdot SA - 1\cdot SB)/(k\cdot n - 1\cdot m) \tag{16}$$

$$S2 = i\cdot(m\cdot HA - k\cdot HB)/(k\cdot n - 1\cdot m) \tag{17}$$

(10-3) Application to Multi-Slice:

The embodiment given above represents the expansion of the sequence for imaging one slice to the double-slice imaging sequence. Multi-slice imaging for imaging a plurality of slices can be easily expanded to a double-slice imaging sequence.

Next, multi-slice imaging will be explained briefly. Multi-slice imaging is carried out in such a manner as to superpose ordinary imaging sequences. To measure one slice, a series of instruments repeat their operations but in many sequences, the time of the practical operations of the instruments is by far smaller than the iteration time TR. In this case, sequences for imaging other slices can be superposed in the empty time within the TR time in which the instruments do not operate. The sequences for imaging other slices can be executed by merely changing the reference frequency of the RF magnetic field. Assuming that the operation time of a series of instruments for imaging one slice within the TR time is TM, imaging sequences of INT (TR/TM) slices can be superposed. This symbol INT means the conversion to an integer by round-down.

It can be understood from the explanation given above that the sequence of multi-slice imaging can be easily expanded to double-slice imaging. In other words, the double-slice imaging sequence of multi-slice imaging can be obtained by converting the sequence for imaging one slice to the sequence of double-slice imaging and superposing it with other sequence for double-slice imaging.

(11) Various Operations Mathematically Equivalent, or Providing Equivalent Effects:

Calculation methods mathematically equivalent or equivalent operations exist for the embodiment described above. Some examples will be given below.

(11-1) Calculation Method Mathematically Equivalent or Providing Equivalent Effects:

As described above, the image data imaged by the NMR imaging apparatus have data in the complex number. However, there are many cases where the image data which are finally calculated as absolute values are displayed or preserved. Among the data of the complex number, those data obtained by multiplying the image as a whole by the coefficient of the same complex number do not have any great difference from the original data for diagnosis. Therefore, there are a large number of calculation methods that provide the similar effects. For example, it is possible to calculate $-A+i\cdot B$, $-A-i\cdot B$, $i\cdot A+B$, $i\cdot A-B$, $-i\cdot A-B$, $-i\cdot A+B$ etc., in place of $A-i\cdot B$, $A+i\cdot B$ of Eqs. (9) and (10), or to calculate $A-C$, $-A+C$, etc., in place of $A+C$, $A-C$ of the separation calculation when the phase shift is effected.

(11-2) Separation Calculation of Slice after imaging:

The embodiment given above illustrates the example where the slice separation calculation is carried out by the use of the signal data and then the imaging calculation is made. However, if the imaging calculation is linear with respect to the superposition of the measurement signals, the slice separation calculation can be carried out after imaging is made. An example is given below where G is the imaging calculation and A and B are the measurement signals:

$$G\{A+i\cdot B\} = G\cdot A + i\cdot G\cdot B$$

$$G\{A-i\cdot B\} = G\cdot A - i\cdot G\cdot B$$

(11-3) Replacement of Signals of the time of Measurement:

The operation of multiplying the measurement signal by i corresponds to the operation which changes the real number portion of the measurement signal to the imaginary number portion and the imaginary portion to the real number portion by changing the codes. Therefore, it is possible to first measure the signal by the A/D, to replace the measurement signal and then to inverse the code of one of them in place of the calculation.

According to the present invention, double-slice imaging can be carried out by the use of the RF magnetic field generator shown in FIG. 3 without adding afresh any hardwares.

We claim:

1. A double-slice imaging method in a nuclear magnetic resonance (NMR) imaging apparatus for obtaining images of slices of an object lying in a space where a static magnetic field is applied, said method comprising the steps of:

selectively exciting magnetizations in a slice of said object by applying a first RF magnetic field pulse amplitude-modulated by a first waveform to said object in the presence of a gradient magnetic field, cosine Fourier components of said first waveform being dominant in comparison with sine Fourier components;

collecting first echo signals of magnetizations excited by said first RF magnetic field pulse;

selectively exciting magnetizations in said slice by applying a second RF magnetic field pulse amplitude-modulated by a second waveform to said object in a presence of said gradient magnetic field, sine Fourier components of said second waveform being dominant in comparison with cosine Fourier components so that a slice profile of magnetizations excited by said second RF magnetic field pulse forms two separate peaks at positions of a first sub-slice of said slice and a second sub-slice of said slice, respectively;

collecting second echo signals of magnetizations excited by said second RF magnetic field pulse;

reconstructing a first image corresponding to said first sub-slice from data of said first and second echo signals; and reconstructing a second image corresponding to said second sub-slice from said data of said first and second echo signals.

2. A double-slice imaging method according to claim 1, wherein said step of reconstructing said first image and said step of reconstructing said second image respectively include at least one of the processings of:

$A+i \cdot B$, $A-i \cdot B$; and
$-A+i \cdot B$, $-A-i \cdot B$; and
$i \cdot A+B$, $i \cdot A-B$; and
$-i \cdot A+B$, $-i \cdot A-B$;

wherein A is data of said first echo signals, B is data of said second echo signals, and i is an imaginary number unit.

3. A double-slice imaging method according to claim 1, wherein a phase shift of 90° exists between a radio frequency signal of said first RF magnetic field pulse and radio frequency signal of said second RF magnetic field pulse, and said step of reconstructing said first image and said step of reconstructing said second image respectively include at least one of the processings of:

$A+C$ and $A-C$; and
$-A+C$ and $-A-C$;

wherein A is data of said first echo signals, and C is data of said second echo signals.

4. A double-slice IMAG method in a nuclear magnetic resonance (NMR) imaging apparatus for obtaining images of slices of an object lying in a space where a static magnetic field is applied, said method comprising the steps of;

selectively exciting magnetizations in a slice of said object by applying a first synthesized RF magnetic field pulse (HA) in a presence of a gradient magnetic field, said first synthesized RF magnetic field pulse (HA) being synthesized according to the following formula and from a first 90° RF magnetic field pulse (HC) in which cosine Fourier components are dominant in comparison with sine Fourier components and a second 90° RF magnetic field pulse (HS) in which sine Fourier components are dominant in comparison with cosine Fourier components:

$HA = K \cdot HC + L \cdot HS$ wherein $K^2 + L^2 = 1$, and each of K and L is a real number;

collecting first echo signals of magnetizations excited by said first synthesized RF magnetic field pulse (HA);

selectively exciting magnetizations in said slice by applying a second synthesized RF magnetic field pulse (HB) in the presence of said gradient magnetic field, said second synthesized RF magnetic field pulse (HB) being synthesized according to the following formula and from said first 90° RF magnetic field pulse (HC) and said second 90° RF magnetic field pulse (HS):

$HB = M \cdot HC + N \cdot HS$ wherein $M^2 + N^2 = 1$, and each of M and N is a real number;

collecting second echo signals of magnetizations excited by said second synthesized RF magnetic field pulse (HB);

reconstructing a first image corresponding to a first sub-slice from data of said first and second echo signals; ad reconstructing a second image corresponding to a second sub-slice from data of said first and second echo signals.

5. A double-slice imaging method in a nuclear magnetic resonance (NMR) imaging apparatus for obtaining images of slices of an object lying in a space where a static magnetic field is applied, said method comprising the steps of:

selecting exciting magnetizations in a slice of said object by applying a first RF magnetic field pulse amplitude-modulated by a first waveform to said object in a presence of a gradient magnetic field, cosine Fourier components of said first waveform being dominant in comparison with sine Fourier components;

collecting first echo signals of magnetizations excited by said first RF magnetic field pulse;

selectively exciting magnetizations in said slice by applying a second RF magnetic field pulse amplitude-modulated by a second waveform to said object in a presence of said gradient magnetic field, sine Fourier components of said second waveform being dominant in comparison with cosine Fourier components so that a slice profile of magnetizations excited by said second RF magnetic field pulse forms two separate peaks at positions of a fist sub-slice of said slice and a second sub-slice of said slice, respectively;

collecting second echo signals of magnetizations excited by said second RF magnetic field pulse;

processing an imaging calculating on data (A) of said first echo signals to obtain a first provisional image data (G·A);

processing an imaging calculation on data (B) of said second echo signals to obtain a second provisional image data (G·B); and processing a slice separation calculation on said first and second provisional image data (G·A and G·B) to obtain an image of said first sub-slice and an image of said second sub-slice, respectively.

6. A double-slice imaging method according to claim 5, wherein said step of processing a slice separation calculation includes the following calculations:

G·A+i·G·B and G·A−i·G·B.

* * * * *